(12) United States Patent
Ogawa et al.

(10) Patent No.: US 8,183,122 B2
(45) Date of Patent: May 22, 2012

(54) SEMICONDUCTOR DEVICE INCLUDING SEMICONDUCTOR THIN FILM, WHICH IS SUBJECTED TO HEAT TREATMENT TO HAVE ALIGNMENT MARK, CRYSTALLIZING METHOD FOR THE SEMICONDUCTOR THIN FILM, AND CRYSTALLIZING APPARATUS FOR THE SEMICONDUCTOR THIN FILM

(75) Inventors: Hiroyuki Ogawa, Nara (JP); Noritaka Akita, Hiratsuka (JP); Yukio Taniguchi, Yokohama (JP); Masato Hiramatsu, Tokyo (JP); Masayuki Jyumonji, Yokohama (JP); Masakiyo Matsumura, Kamakura (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/838,206

(22) Filed: Jul. 16, 2010

(65) Prior Publication Data
US 2010/0304546 A1 Dec. 2, 2010

Related U.S. Application Data

(62) Division of application No. 11/194,607, filed on Aug. 2, 2005, now abandoned.

(30) Foreign Application Priority Data

Aug. 9, 2004 (JP) ................................. 2004-232745
Aug. 9, 2004 (JP) ................................. 2004-232750

(51) Int. Cl.
*H01L 21/76* (2006.01)
(52) U.S. Cl. .......... 438/401; 438/482; 438/488; 257/49; 257/E21.002

(58) Field of Classification Search .................. 438/401, 438/482, 488; 257/E21.002, 49
See application file for complete search history.

(56) References Cited

U.S. PATENT DOCUMENTS 5,656,825 A * 8/1997 Kusumoto et al. .............. 257/66
6,198,149 B1 3/2001 Ishigaki
6,608,326 B1 8/2003 Shinagawa et al.
(Continued)

FOREIGN PATENT DOCUMENTS
CN 1476062 A 2/2004
(Continued)

OTHER PUBLICATIONS

Masakiyo Matsumura, "Preparation of Ultra-Large Grain Silicon Thin-Films by Excimer-Laser", Journal of the Surface Science Society of Japan, vol. 21, No. 5, 2000, pp. 278-287, (provided in DIV U.S. Appl. No. 11/194,607).

*Primary Examiner* — Bradley K Smith
*Assistant Examiner* — Mohammad T Karimy
(74) *Attorney, Agent, or Firm* — Birch, Stewart, Kolasch & Birch, LLP

(57) ABSTRACT

Exact alignment of a recrystallized region, which is to be formed in an amorphous or polycrystalline film, is facilitated. An alignment mark is formed, which is usable in a step of forming an electronic device, such as a thin-film transistor, in the recrystallized region. In addition, in a step of obtaining a large-grain-sized crystal-phase semiconductor from a semiconductor film, a mark structure that is usable as an alignment mark in a subsequent step is formed on the semiconductor film in the same exposure step. Thus, the invention includes a light intensity modulation structure that modulates light and forms a light intensity distribution for crystallization, and a mark forming structure that modulates light and forms a light intensity distribution including a pattern with a predetermined shape, and also forms a mark indicative of a predetermined position on a crystallized region.

11 Claims, 24 Drawing Sheets

U.S. PATENT DOCUMENTS

| | | | |
|---|---|---|---|
| 6,864,946 B2 * | 3/2005 | Kim | 349/156 |
| 2004/0011772 A1 | 1/2004 | Okumura | |

FOREIGN PATENT DOCUMENTS

| | | |
|---|---|---|
| JP | 403292717 | 12/1991 |
| JP | 2000-277450 | 10/2000 |
| JP | 2000-306859 | 11/2000 |
| JP | 2002-151407 | 5/2002 |
| JP | 2002-203861 | 7/2002 |
| JP | 2005-235811 | 9/2005 |

* cited by examiner

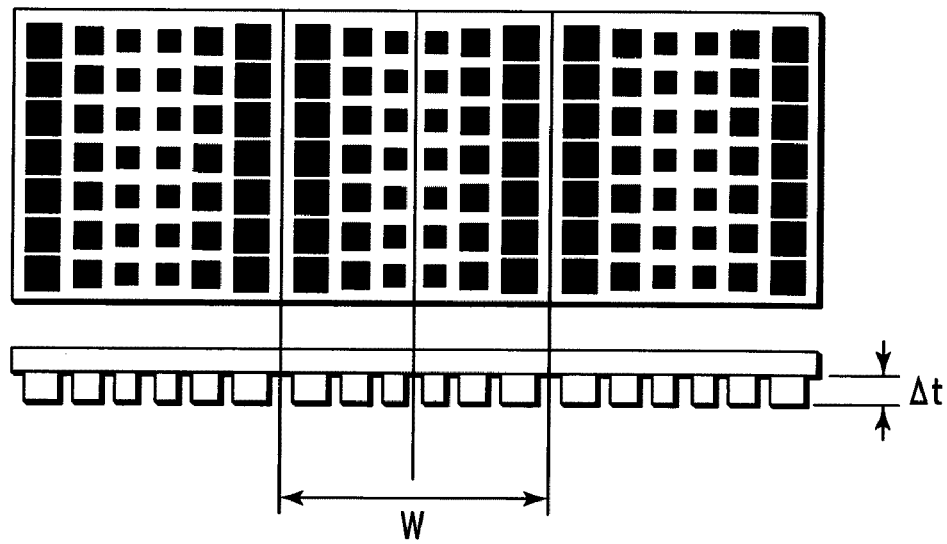
F I G. 5A
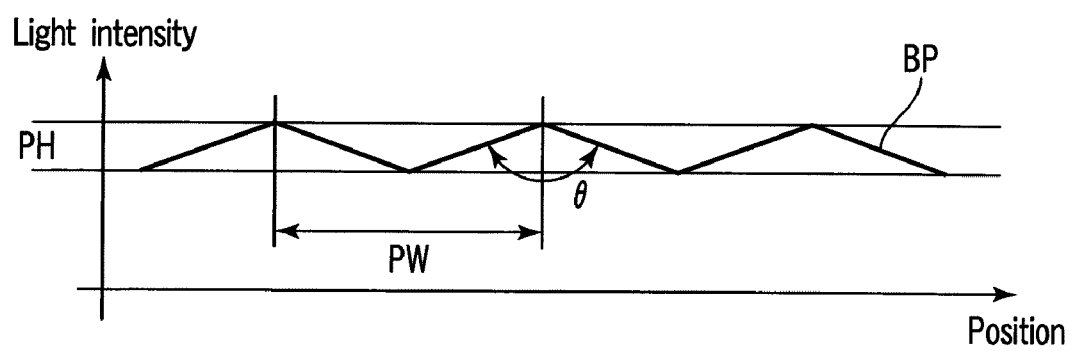
F I G. 5B

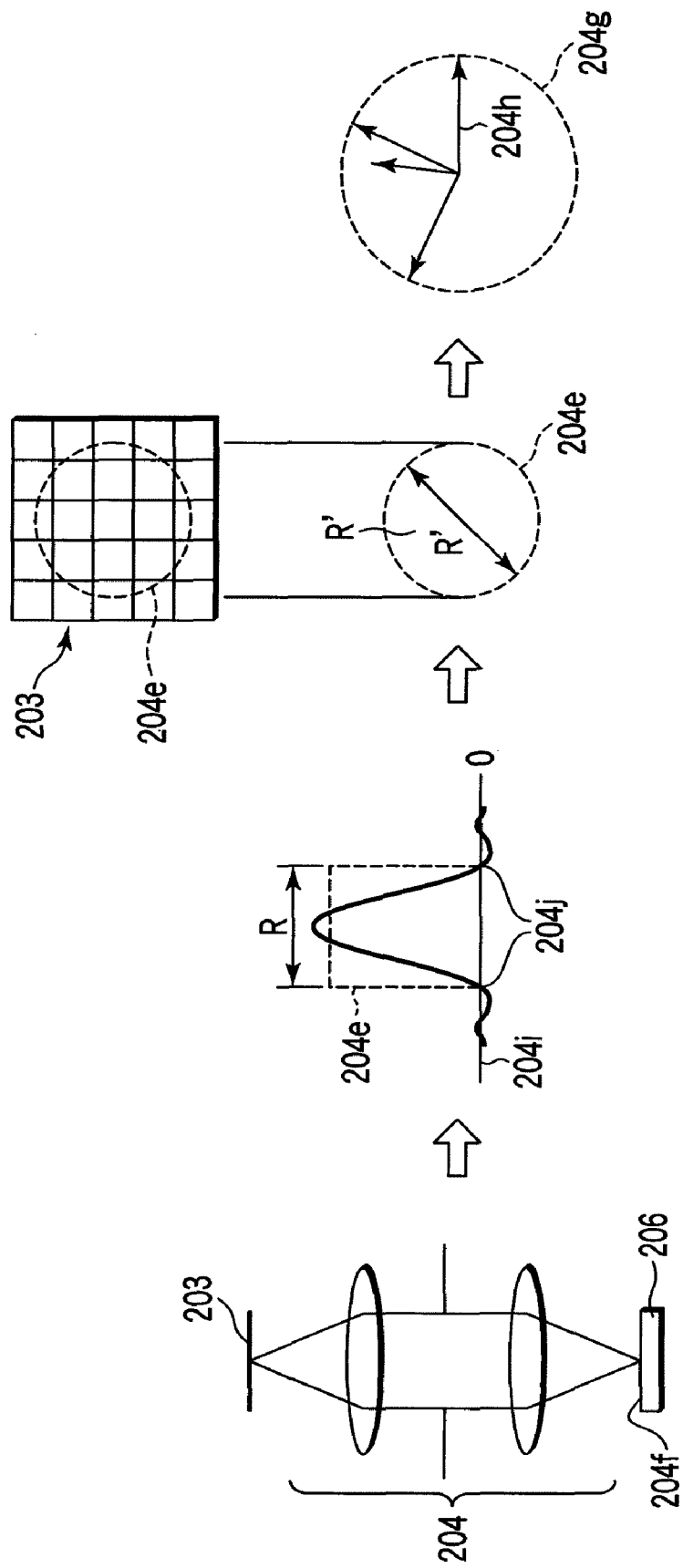

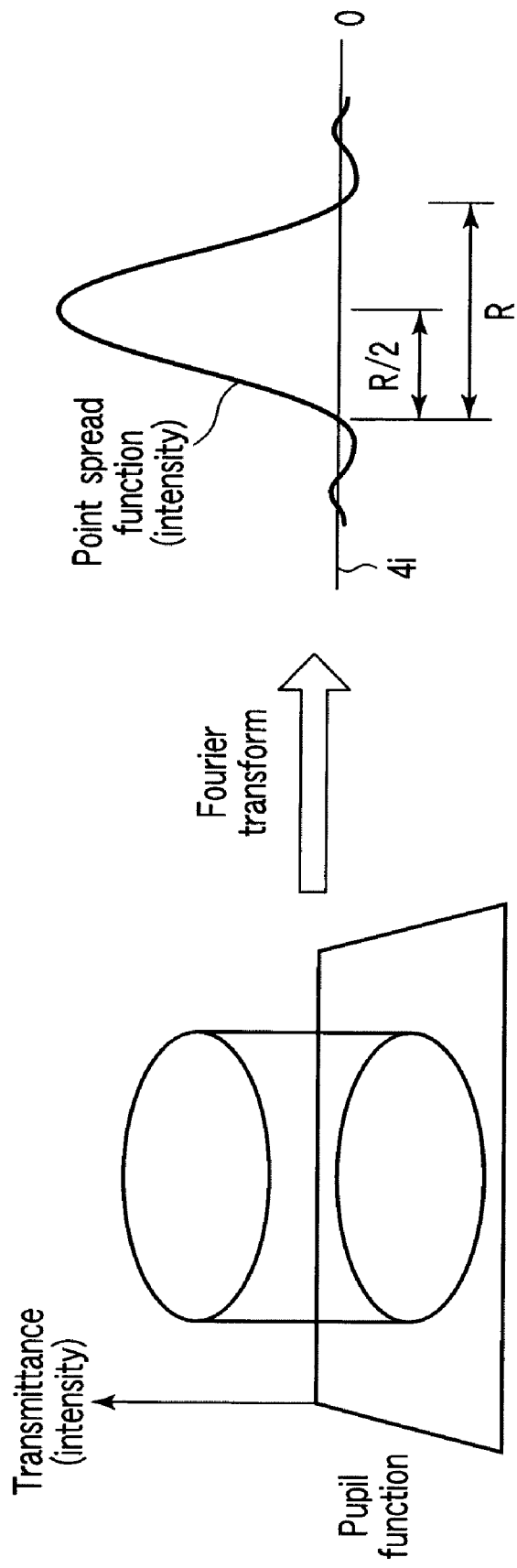

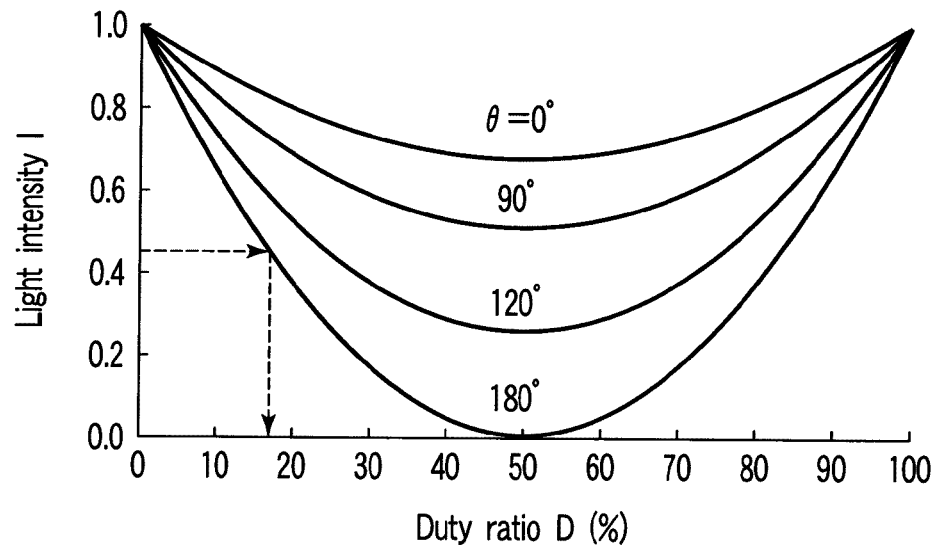
F I G. 17
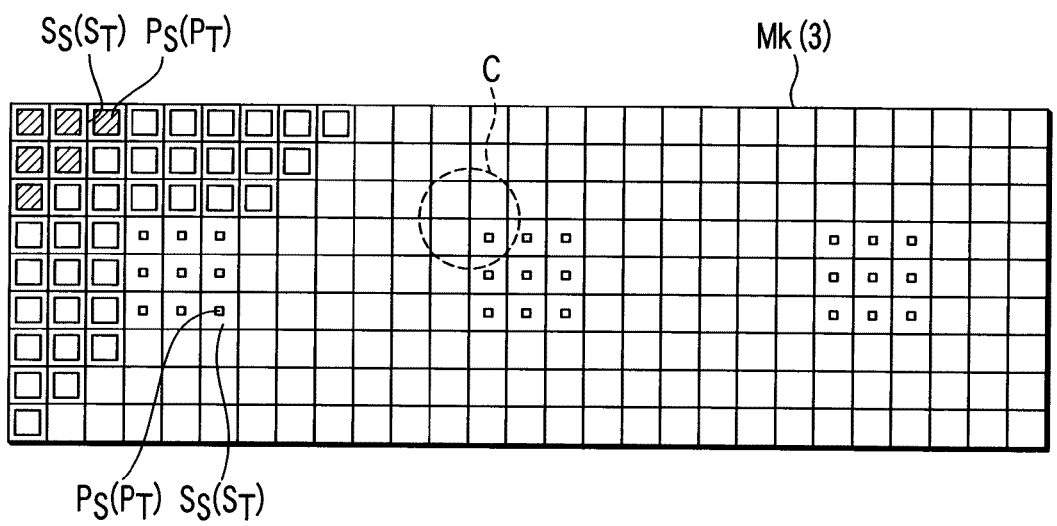
F I G. 18

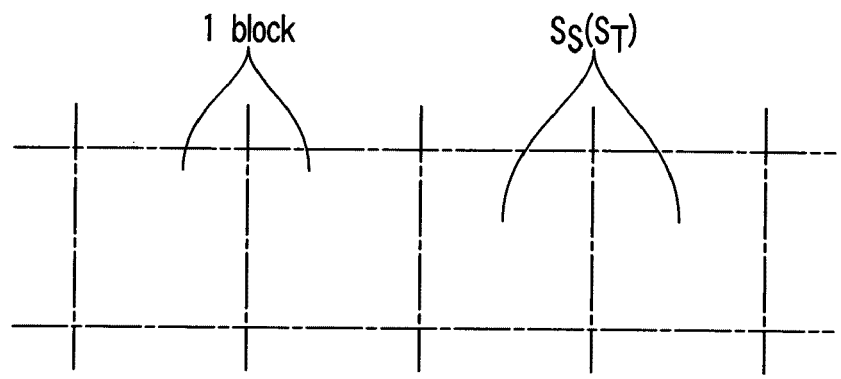
F I G. 19A
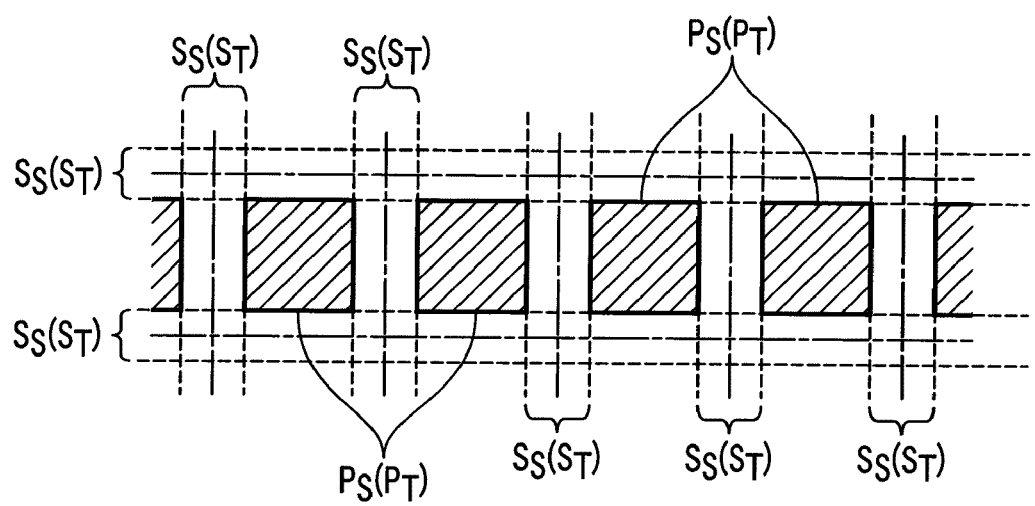
F I G. 19B
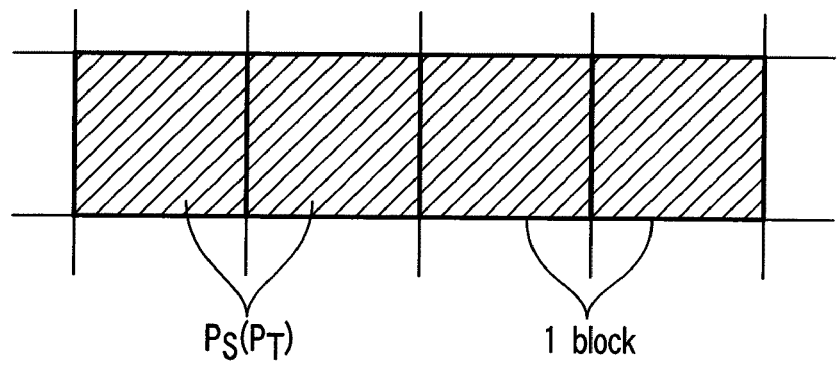
F I G. 19C

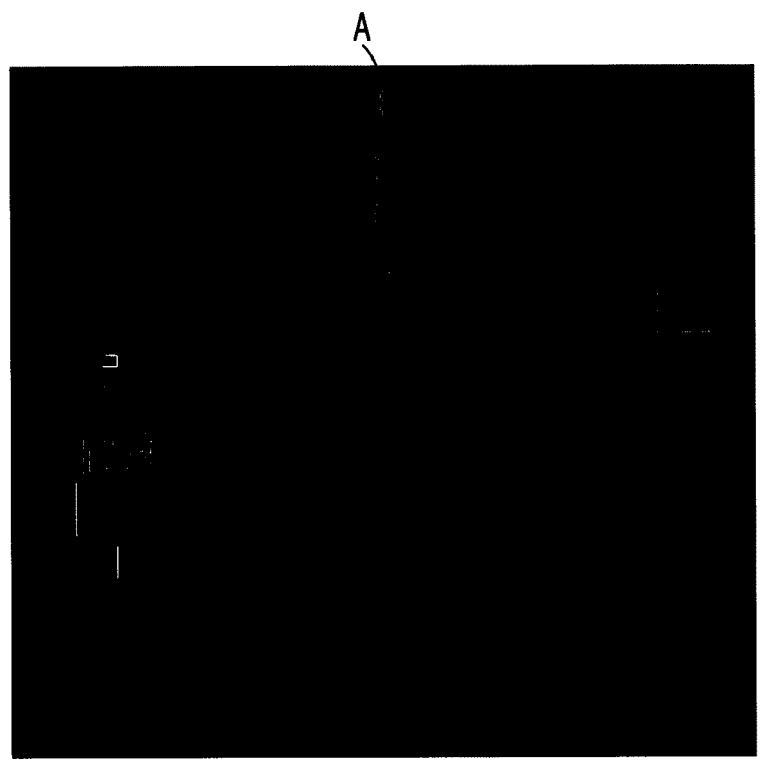
F I G. 23A
F I G. 23B

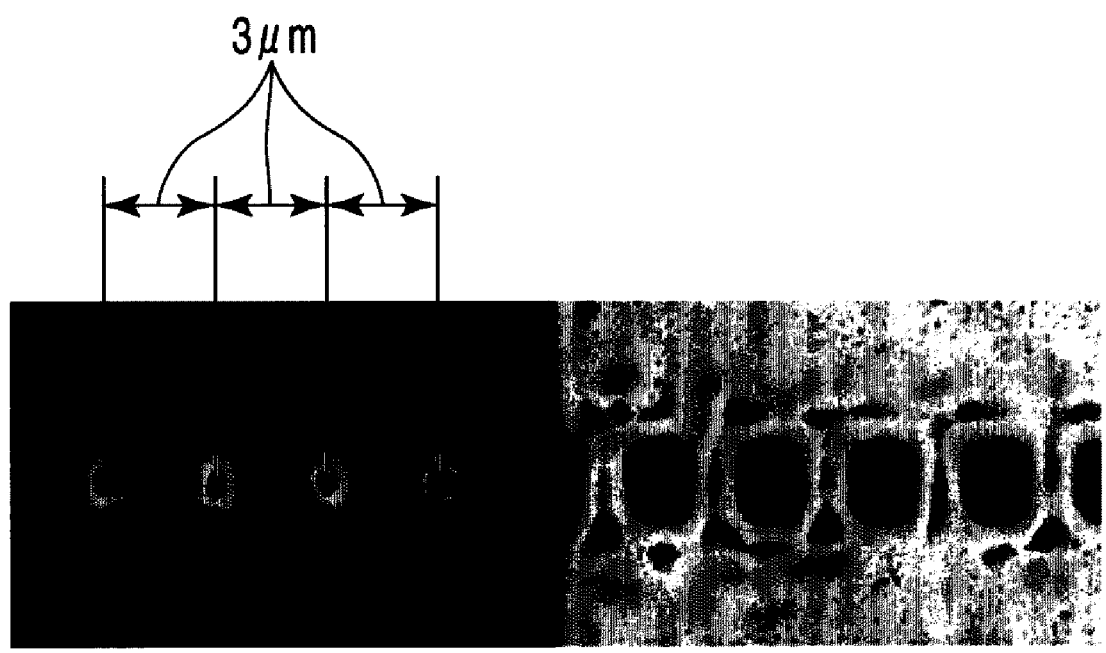
F I G. 24

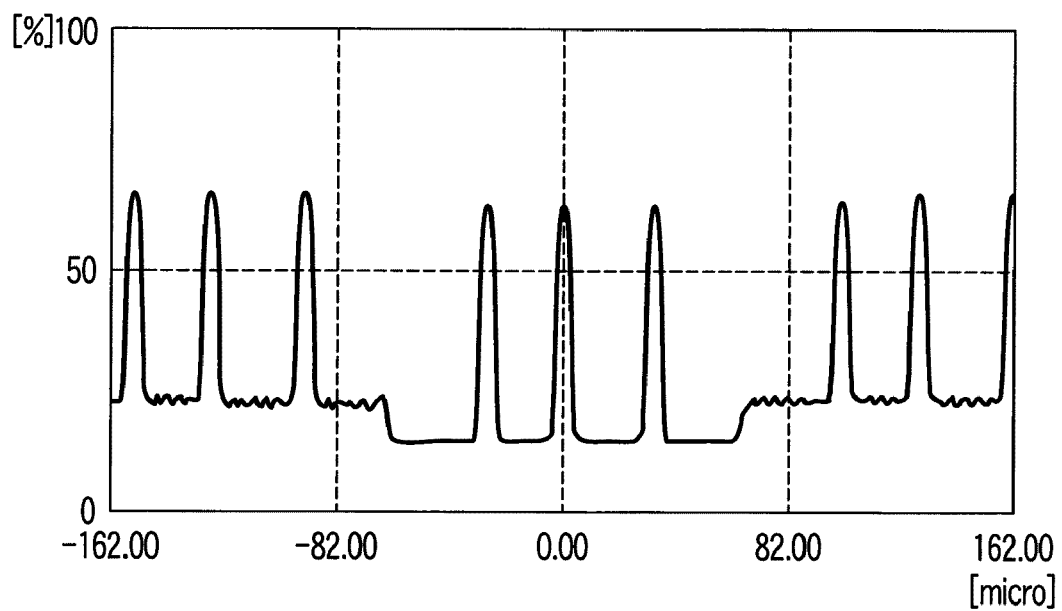
F I G. 25
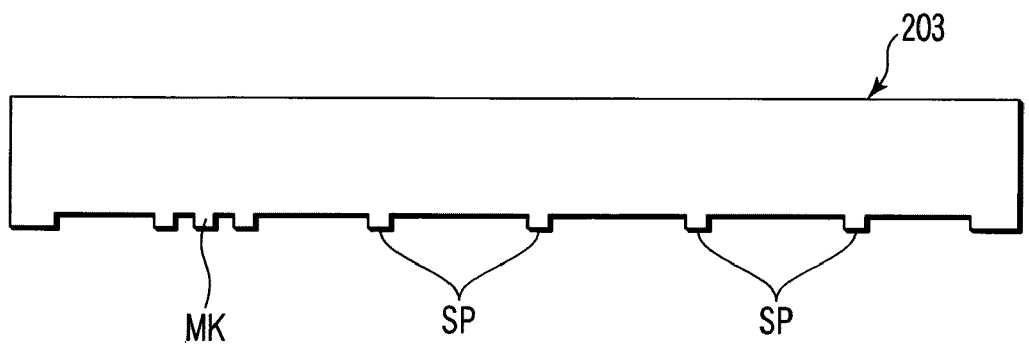
F I G. 26

SEMICONDUCTOR DEVICE INCLUDING SEMICONDUCTOR THIN FILM, WHICH IS SUBJECTED TO HEAT TREATMENT TO HAVE ALIGNMENT MARK, CRYSTALLIZING METHOD FOR THE SEMICONDUCTOR THIN FILM, AND CRYSTALLIZING APPARATUS FOR THE SEMICONDUCTOR THIN FILM

CROSS-REFERENCE TO RELATED APPLICATIONS

This application is a Divisional of and claims the benefit of priority from U.S. Ser. No. 11/194,607, filed Aug. 2, 2005, which claims the benefit of priority from Japanese Patent Application Nos. 2004-232745, filed Aug. 9, 2004; and 2004-232750, filed Aug. 9, 2004, the entire contents of each of which are incorporated herein by reference.

BACKGROUND OF THE INVENTION

1. Field of the Invention

The present invention relates to a crystallizing method for a semiconductor thin film, a substrate having a crystallized semiconductor thin film, a crystallizing apparatus for a semiconductor thin film, a light modulation element for use in the crystallizing apparatus, a semiconductor device formed in a crystallized thin film, and a manufacturing method for a thin-film semiconductor device, which are all applicable to an electronic apparatus such as an active-matrix flat-panel display. In particular, the present invention relates to a technology for forming an alignment mark for alignment in a case where a large-grain-sized recrystallized region is formed in an amorphous or polycrystal semiconductor thin film.

2. Description of the Related Art

A semiconductor film formation technology is an important technology for forming, on an insulating substrate, a semiconductor device such as a thin-film transistor (TFT), a contact-type sensor or a photoelectric conversion device. In usual cases, field-effect transistors with a MIS architecture, in particular, with a MOS architecture, are used as thin-film transistors.

For example, a liquid crystal display, which is an example of a flat-panel display, has such general characteristics that the display is thin in size and light in weight, the power consumption is low and color display is easily realized. By virtue of these characteristics, liquid crystal displays are widely used as displays for personal computers and other various mobile information terminals. In the case where the liquid crystal display is of an active-matrix type, thin-film transistors are used as switching devices for pixels, and as devices that constitute pixel-driving circuits.

In many cases, an active layer, that is, a carrier movement layer, of the thin-film transistor is formed of a silicon semiconductor thin film. In usual cases, the silicon semiconductor thin film is formed on an insulating substrate by, e.g. CVD or sputtering. Depending on conditions such as the temperature for film formation and the rate of film formation, the silicon semiconductor thin film is formed on the insulating substrate as amorphous silicon or polycrystalline silicon comprising many crystal grains that are divided by crystal grain boundaries.

Compared to crystalline silicon, the amorphous silicon has a carrier mobility that is lower by one or two orders of magnitude. Thus, in general, an amorphous silicon film, which is once formed, is crystallized by high-temperature heat treatment, and the crystallized silicon is used.

The carrier mobility of the polycrystal silicon, which is formed by the crystallization, is about 10 times to 100 times higher than that of amorphous silicon. This characteristic is very excellent for a semiconductor film material, of which a switching device for, e.g. a liquid crystal display is to be formed. Under the circumstances, there has recently been proposed a crystallizing method in which large-grain-sized crystallized silicon is produced in order to enhance the mobility of electrons or holes and to reduce the non-uniformity in grain boundaries in the channel region.

In recent years, applications of thin-film transistors, in which polysilicon is used as active layers, have vigorously been developed. Thin-film transistors using crystallized silicon have drawn special attention as switching devices that constitute logic circuits, such as domino logic gates and CMOS transmission gates, for their ability to execute high-speed operations. These logic circuits have been used in, for instance, driving circuits for liquid crystal displays or electroluminescent (EL) displays, multiplexers, EPROMs, EEPROMs, CCDs and RAMs.

A description will now be given of a typical prior-art process of forming a silicon thin film including a polysilicon region. In this process, an insulating substrate formed of, e.g. glass is first prepared. An $SiO_2$ film, for instance, is then formed on the surface of the insulating substrate as an undercoat layer or a buffer layer. Subsequently, an amorphous silicon film with a thickness of about 50 nm is formed on the undercoat layer by, e.g. CVD. The amorphous silicon film is subjected to dehydrogenation treatment in order to lower the hydrogen concentration in the amorphous silicon film. The amorphous silicon film is crystallized by, e.g. an excimer laser crystallization method. Specifically, an excimer laser beam is applied to the amorphous silicon film. Thus, the amorphous silicon is melted and recrystallized into polycrystalline silicon.

At present, a silicon thin film, which is formed of the thus obtained polysilicon, is used as an active layer of an n-channel or p-channel thin-film transistor. In this case, the mobility (mobility of electrons or holes by electric field) of the thin-film transistor is about 100 to 150 $cm^2/V$ sec in the case of the n-channel type transistor, and is 80 $cm^2/V$ sec in the case of the p-channel type transistor. Using such thin-film transistors, driving circuits such as a signal line driving circuit and a scan line driving circuit may be formed on the same substrate as pixel switching devices, and thus a display in which driving circuits are integrated can be fabricated. This integral architecture can reduce the manufacturing cost of the display.

However, the electrical characteristics of the thin-film transistor, which is fabricated using the polycrystalline silicon thin film that is crystallized by the prior-art method, are not so high that the thin-film transistor can be applied to a DC converter that converts digital video data to analog video data, or to a signal processing circuit, such as a gate array, that processes digital video data. In order to apply the thin-film transistor to, e.g. a DC converter or a signal processing circuit, it is considered that a current driving performance, which is two to five times higher that that of the above-described thin-film transistor, is necessary. In addition, a field-effect mobility of about 300 $cm^2/V$ sec is necessary.

In order to achieve higher-level functions and higher added values of the display, it is necessary to further improve the electrical characteristics of the thin-film transistor. For example, in a case where a static memory that is composed of a thin-film transistor is added to each pixel in order to provide a memory function, this thin-film transistor needs to have electrical characteristics that are substantially equal to the electrical characteristics of a transistor using a single-crystal semiconductor. Thus, it is necessary to improve the characteristics of the semiconductor film.

A possible approach to improve the characteristics of a semiconductor film is to make the crystallinity of the semiconductor film closer to that of a single crystal. If the entire semiconductor film on the insulating substrate can be made into a single crystal, it becomes possible to obtain characteristics that are similar to those of a device using an SOI substrate, which has been investigated as a next-generation LSI. This attempt has been conducted for more than ten years as a 3-D device research project, but a technology for single-crystallizing the entirety of a semiconductor film has not been established. At present, there has still been a demand for formation of a semiconductor film of a single crystal on an insulating substrate.

As regards crystallization of an amorphous semiconductor film, a technique has been proposed wherein a crystallized crystal grain in the semiconductor film is grown to a larger size so that almost the same effect as in a case of substantially single-crystallizing the amorphous semiconductor film can be obtained. In this method, an excimer laser beam, which is spatially intensity-modulated with use of a phase shifter, is radiated. In this phase-modulation excimer laser crystallization method, a temperature distribution is imparted to an amorphous silicon thin film, and the amorphous silicon thin film is melted and recrystallized. Thereby, a large-grain-sized crystallized region is obtained in the crystallized silicon thin film.

In the phase-modulation excimer laser crystallization method, a phase shifter is employed to impart an intensity distribution to an excimer laser beam on the plane of the silicon thin film, a temperature gradient corresponding to the intensity distribution is provided in the silicon thin film. The temperature gradient facilitates growth of crystal silicon grains from a lower-temperature region toward a higher-temperature region in a direction parallel to the plane of the silicon thin film. As a result, compared to the conventional laser crystallization method, larger-sized crystal silicon grains can be grown.

According to this method, a crystallized silicon grain is grown to a grain size of about several microns, which can contain at least a channel region of an active device such as a thin-film transistor. By forming a thin-film transistor in the large crystal silicon grain region, it becomes possible to obtain the thin-film transistor with electrical characteristics that meet the above-described requirement.

The phase-modulation excimer laser crystallization method is an effective technique for obtaining large-grain-sized crystal silicon. However, in the phase-modulation excimer laser crystallization method, a microcrystal first grows in a low-temperature region where crystal growth beings. With this microcrystal functioning as a seed, a larger crystal grain grows. Consequently, in the recrystallized silicon thin film, there are both a region comprising a large-grain-sized crystalline silicon grain and a polycrystalline region comprising small-grain-sized crystalline silicon grains. In the case of adopting this crystallization process, it is thus necessary to exactly position a subsequently formed thin-film transistor in the region comprising the large-grain-sized crystalline silicon grain.

If the thin-film transistor is displaced from the large-grain-sized crystalline silicon region and is formed in the polycrystalline region, the electrical characteristics of the thin-film transistor would considerably deteriorate. If such a thin-film transistor with deteriorated electrical characteristics is included in, e.g. a flat-panel display, the flat-panel display would become a defective one and the manufacturing yield would considerably lower. In the case of successively forming a plurality of large-grain-sized recrystallized silicon regions in order to form a plurality of thin-film transistors on the same substrate, a sufficient positional precision cannot be obtained if the substrate is moved only by a mechanical method.

In order to solve this problem, an attempt has been made to form an alignment mark in advance in a crystallization process. Specifically, an alignment mark is formed in advance on an undercoat layer or a support substrate prior to recrystallization. A crystallizing process is executed in accordance with the alignment mark.

FIG. 9 illustrates an example of a prior-art alignment mark formation method. In order to form a silicon thin film in which a thin-film transistor (not shown) is to be formed, an insulating substrate 111 of, e.g. glass or quartz is prepared. Where necessary, an undercoat layer (not shown) of, e.g. $SiO_2$ is formed on the insulating substrate 111. Subsequently, an alignment mark 112 of a predetermined shape is formed on the surface of the insulating substrate 111 or undercoat layer by, e.g. lithography or chemical etching. Then, for instance, an amorphous silicon thin film or polysilicon thin film 113 is formed on the support substrate. By optically recognizing the alignment mark 112, the position of the insulating substrate 111 is confirmed and a predetermined region 114 is crystallized by a phase-modulation excimer laser crystallization method.

The crystallized region 114 includes both a polycrystalline region 116 comprising small-grain-sized silicon grains, from which crystallization has begun, and a large-grain-sized crystal region 115 comprising a large-grain-sized single crystal that has been grown from the small-grain-sized silicon grain. Crystallization is performed with reference to the alignment mark 112, and the polycrystalline region 116, which is the crystallization start region, and the large-grain-sized crystal region 115 are disposed at predetermined positions on the insulating substrate.

The above-described prior-art method, however, requires an additional step of forming the alignment mark 112 by, e.g. lithography. Thus, such a problem arises that the manufacturing process becomes longer.

On the other hand, an active layer (carrier movement layer) of the thin-film transistor is formed of, e.g. a silicon semiconductor thin film. Silicon semiconductor films are generally classified into amorphous silicon (a-Si) films and polycrystalline (non-single-crystal crystalline silicon) films.

The polycrystalline silicon is mainly polysilicon (poly-Si), but microcrystal silicon (μc-Si) is also known as polycrystalline silicon. Usable semiconductor film materials other than silicon include, for instance, SiGe, SiO, CdSe, Te and CdS.

As a crystallization method for increasing the crystal grain size of crystallized silicon, there has been proposed a method in which light with a specified intensity distribution, which is produced by interposing a phase shifter (phase modulation element) in an optical system, is radiated on a semiconductor film that is an object of processing (see, e.g. Jpn. Pat. Appln. KOKAI Publication No. 2000-306859 (hereinafter referred to as Document 1)).

In addition, as a method of increasing the grain size of a crystal grain in crystallizing an amorphous semiconductor thin film, it has been proposed by the inventors of the present invention to radiate an excimer laser beam that is spatially intensity-modulated by using a phase modulation element. In this method, an amorphous silicon thin film is melted and recrystallized by a laser beam, and thus made into a polysilicon thin film. This method is called "phase-modulation excimer laser crystallization method" (see, e.g. Surface Science, Vol. 21, No. 5, pp. 278-287, 2000 (hereinafter referred to as Document 2)). The inventors have been advancing development for industrializing this technology.

A large-grain-sized single-crystal silicon grain, which is formed by the crystallization method of Document 2, is surrounded by countless small-grain-sized polycrystalline silicon grains or by amorphous silicon. The large-grain-sized single-crystallized silicon grain has such a size as to permit formation of a channel region or channel regions of one or more thin-film transistors.

The inventors have been advancing development for industrializing, e.g. the crystallization method disclosed in Document 2. Even if a large-grain-sized silicon grain is successfully obtained by this development, there arises such a case that a channel region of a thin-film transistor is not formed within the region of the large-grain-sized single-crystal silicon grain. If the positional displacement occurs, such a problem arises that the electrical characteristics of the thin-film transistor, for example, switching characteristics, would extremely deteriorate.

It is thus imperative to make the large-grain-sized single-crystal silicon grain, which is obtained by the above-described crystallization, agree with the channel region of the thin-film transistor in order to achieve high-speed switching characteristics of the thin-film transistor. In order to make the large-grain-sized single-crystal silicon grain agree with the position of formation of the thin-film transistor, when crystallization is performed by the phase-modulation method, the inventors have been studying simultaneous formation of an alignment mark for alignment.

In the method of performing the crystallization by the phase-modulation method, a high fluence is required. However, with such a high fluence, ablation (film destruction) occurs in a region that does not undergo phase modulation. Thus, there is such a problem that formation of a crystal grain and formation of an alignment mark cannot be performed at the same time.

A method and an apparatus for making the range of the large-grain-sized single-crystal silicon grain, which is formed on the substrate, exactly agree with the position, where the thin-film transistor is to be formed, have not been established.

The present invention can provide a method and an apparatus, which are capable of exactly forming a semiconductor active device, that is, a switching device, in a region where a large-grain-sized crystal grain is formed by crystallization, by virtue of the formation of an alignment mark that characterizes the present invention.

BRIEF SUMMARY OF THE INVENTION

Regions with different crystallinities on a semiconductor film are optically recognizable. If regions with different crystallinities are formed in predetermined shapes, such regions can be used as alignment marks. In an embodiment of the invention, an alignment mark that is needed in a subsequent crystallizing process is formed by initial laser irradiation. Specifically, using an alignment mark that is formed by initial laser irradiation, a substrate is aligned and a crystallizing process is performed. A large-grain-sized single-crystal grain is formed by the crystallizing process. In another embodiment of the invention, in the initial laser irradiation process for crystallization, an alignment mark that is needed in lithography in a fabrication step of a thin-film transistor is formed at the same time.

According to an embodiment of the invention, there is provided a crystallizing method for crystallizing an amorphous or polycrystalline semiconductor film using a laser, comprising: forming an alignment mark at a predetermined position on the amorphous or polycrystalline semiconductor film by first laser irradiation; and forming a crystallized region with a large grain size by second laser irradiation, using alignment based on the alignment mark.

In this crystallizing method, the second laser irradiation has a higher energy density than the first laser irradiation. In addition, in the crystallizing method, the second laser irradiation is executed through a phase shifter. In the step of forming the alignment mark, an alignment mark for lithography, which is needed in a subsequent step of fabricating a thin-film transistor, is formed at the same time.

According to an embodiment of the invention, there is provided a semiconductor film formation substrate comprising a support substrate and a semiconductor film formed on a surface of the support substrate, wherein the semiconductor film includes: an alignment mark part that is formed by first laser irradiation at a predetermined position; and a recrystallized region with a large grain size, which is formed by second laser irradiation.

The semiconductor film formation substrate further comprises an undercoat layer that is formed of an insulating material between the support substrate and the semiconductor film. In addition, the semiconductor film formation substrate further comprises a protection film that is formed of an insulating material on a surface of the semiconductor film.

According to an embodiment of the invention, there is provided a light modulation element comprising: a first light intensity modulation structure that modulates light and forms a light intensity distribution for crystallization; and a second light intensity modulation structure that is formed integral with, or separately from, the first light intensity modulation structure, modulates light and forms a light intensity distribution for formation of an alignment mark that is indicative of a predetermined position on a crystallized region.

In the light modulation element, the second light intensity modulation structure includes a pattern that is capable of lowering a light intensity to an arbitrary value, compared to a light intensity for crystallization. In the light modulation element, the second light intensity modulation structure is a structure that varies a light intensity at a time of image focusing. In the light modulation element, the structure that varies a light intensity at a time of image focusing selectively or partly varies a phase modulation value. In the light modulation element, the structure that varies a light intensity at a time of image focusing varies an area that is capable of transmitting light. In the light modulation element, the second light intensity modulation structure varies a light transmission amount of a pattern that is capable of transmitting light. In the light modulation element, the second light intensity modulation structure is configured such that an area of a light transmissive region per unit area or an area of a region with a different phase per unit area is determined by a mesh-like or dot-like pattern.

According to an embodiment of the invention, there is provided a light modulation element comprising two or more kinds of light intensity modulation regions that modulate light and form a predetermined light intensity distribution, wherein at least one of the two or more kinds of light intensity modulation regions is composed of two kinds of basic patterns, a first basic pattern of the two kinds of basic patterns comprising a set of a light-blocking region and a light-transmissive region, and a second basic pattern of the two kinds of basic patterns comprising only a light-blocking region, or a set of a light-blocking region, whose ratio in area is greater than the light-blocking region of the first basic pattern, and a light-transmissive region.

According to an embodiment of the invention, there is provided a light modulation element comprising two or more kinds of light intensity modulation regions that modulate light and form a predetermined light intensity distribution, wherein at least one of the two or more kinds of light intensity modulation regions includes a first basic pattern, which comprises a set of two or more kinds of phase modulation regions with different phase modulation values, and a second basic pattern, which comprises only a region with a single phase value, or a set of two or more kinds of phase modulation regions with different phase values, which have a ratio in area different from a ratio in area in the first basic pattern.

According to an embodiment of the invention, there is provided a method of manufacturing a thin-film semiconductor substrate, wherein predetermined regions are crystal-grown by successively radiating light from a light source on the thin-film semiconductor substrate with a non-single-crystal semiconductor film in units of a predetermined area, comprising: forming, with respect to the light from the light source, a first light intensity distribution for crystallizing a predetermined region of the non-single-crystal semiconductor film, or a second light intensity distribution for forming an alignment mark, whose optical characteristics are different from optical characteristics of the non-single-crystal semiconductor film, at a predetermined position on the non-single-crystal semiconductor film; irradiating the non-single-crystal semiconductor film with light having the first or second light intensity distribution at a predetermined timing; and crystal-growing a predetermined region of the non-single-crystal semiconductor film and forming the alignment mark at the predetermined position.

In the method of manufacturing a thin-film semiconductor substrate, the first and second light intensity distributions are formed at the same time, and the light with the first and second light intensity distributions is radiated on the non-single-crystal semiconductor film at the same time.

According to an embodiment of the invention, there is provided a thin-film semiconductor device comprising a semiconductor layer that is crystal-grown from a non-single-crystal semiconductor film provided on an object of irradiation, and an alignment mark that is formed in the non-single-crystal semiconductor film, the semiconductor layer and the alignment mark being formed by irradiating the non-single-crystal semiconductor film in units of a predetermined area with light that is provided with a first light intensity distribution for crystallizing the non-single-crystal semiconductor film and a second light intensity distribution for forming the alignment mark, which is indicative of a position on a crystallized region, by using one of the above-mentioned light modulation elements.

According to an embodiment of the invention, there is provided a method of manufacturing a thin-film semiconductor device, comprising: forming a first light intensity distribution for crystallizing a non-single-crystal semiconductor film provided on an object of irradiation, and a second light intensity distribution for forming an alignment mark, which is indicative of a position on a crystallized region, by using one of the above-mentioned light modulation elements; radiating light in units of a predetermined area, the light having the first light intensity distribution for crystallization and the second light intensity distribution for forming the alignment mark indicative of the position on the crystallized region; and forming a crystal-grown semiconductor layer and the alignment mark in the non-single-crystal semiconductor film.

According to an embodiment of the invention, there is provided a display comprising: a plurality of pixel electrodes that are provided in a matrix in a row direction and a column direction; a plurality of thin-film transistors connected to the plurality of pixel electrodes; and scan lines and signal lines that are electrically connected to the plurality of thin-film transistors, wherein the pixel electrodes, the thin-film transistors, the scan lines and the signal lines are formed on the semiconductor film formation substrate, and the display further includes a display mechanism capable of displaying information on the basis of operations of the thin-film transistors corresponding to signals that are supplied to the signal lines.

According to an embodiment of the invention, there is provided a display comprising: a switching device including a region that is obtained by patterning a semiconductor layer in a predetermined shape, the semiconductor layer being crystal-grown from a non-single-crystal semiconductor film provided on an object of irradiation by irradiating the non-single-crystal semiconductor film in units of a predetermined area with light that is provided with a light intensity distribution for crystallizing the non-single-crystal semiconductor film and a light intensity distribution including a pattern, which is indicative of a position on a crystallized region, by using one of the above-mentioned light modulation elements; a signal line connected to the switching device; a counter-electrode that is opposed with a predetermined distance to an insulating substrate on which the switching device is formed; and a display mechanism capable of displaying information on the basis of an operation of the switching device corresponding to a signal that is supplied to the signal line.

According to an embodiment of the invention, there is provided a crystallizing method for radiating light with two or more kinds of light intensity distributions to a non-single-crystal semiconductor film and crystallizing the non-single-crystal semiconductor film, wherein of first and second light intensity distribution regions for providing the two or more kinds of light intensity distributions, the second light intensity distribution region is composed of two kinds of regions with different light intensities, and a relationship, $I_1 > I_2 > I_3$, is established, where $I_1$ is a maximum value of light intensity of the first light intensity distribution region, and $I_2$ and $I_3$ are a high value and a low value, respectively, of the light intensity of the second light intensity distribution region.

In the crystallizing method, when a minimum light intensity, at which ablation occurs in the non-single-crystal semiconductor film due to radiation of light with a uniform light intensity distribution, is $I_a$, a relationship, $I_a > I_2 > I_3$, is established. In the crystallizing method, when a minimum light intensity, at which the non-single-crystal semiconductor film is melted by radiation of light with a uniform light intensity distribution, is $I_c$, a relationship, $I_2 > I_c > I_3$, is established.

According to an embodiment of the invention, there is provided a phase shifter comprising: a light intensity modulation structure that modulates light and forms a light intensity distribution for crystallizing a semiconductor film; and an alignment mark forming structure that is formed integral with, or separately from, the light intensity modulation structure and is formed of the same member as the light intensity modulation structure, the alignment mark forming structure modulating light and forming a light intensity distribution including a pattern with a predetermined shape, and forming an alignment mark that is indicative of a predetermined position on a crystallized region.

In the phase shifter, the light intensity modulation structure includes one of the above-mentioned light modulation elements.

According to an embodiment of the invention, there is provided an apparatus for crystallizing a semiconductor thin film, comprising: a light source that emits light with a predetermined wavelength; one of the above-mentioned light modulation element; and an object hold mechanism that holds an object of irradiation and is freely movable.

According to an embodiment of the invention, there is provided an apparatus including a thin-film transistor formed in an amorphous or polycrystalline semiconductor film lying on a substrate that has a surface formed of an insulating material, the apparatus comprising, at least, an alignment mark including a region that is formed by subjecting the amorphous or polycrystalline semiconductor film to thermal metamorphism such that the region has optical characteristics in a reflective state, which are different from optical characteristics of the amorphous or polycrystalline semiconductor film, and a thin-film transistor provided in a region that is formed by partly single-crystallizing the amorphous or polycrystalline semiconductor film.

According to an embodiment of the invention, the intensity of irradiation light can freely be varied. Therefore, in the same step as irradiation of a fluence for obtaining a large-grain-sized crystal-phase semiconductor from a semiconductor film, it is possible to form, at the same time, an alignment mark on a to-be-processed substrate having a thin-film semiconductor.

BRIEF DESCRIPTION OF THE SEVERAL VIEWS OF THE DRAWING

FIG. 5A shows a phase shifter with stepped portions arranged in a lattice fashion, which is usable in the present invention, and FIG. 5B shows a light intensity distribution associated with the phase shifter;

FIG. 13A to FIG. 13D are schematic views for explaining the principle, based on which the mark pattern and phase modulating structure shown in FIG. 12A can vary the intensity of transmissive light;

FIG. 15A and FIG. 15B are schematic views for explaining the relationship between a pupil function and a point spread function of an image-focusing optical system that is incorporated in the crystallizing apparatus shown in FIG. 10;

FIG. 17 is a graph for explaining the relationship between the light intensity and phase difference and the relationship between the part with the first phase value and the part with the second phase value with respect to the light that passes through the mark pattern (phase modulation element) shown in FIGS. 16A to 16C;

FIG. 18 is a schematic view for describing the mark pattern shown in FIG. 11, wherein a light-blocking metal thin film is selectively provided so that a pair of a shield part and a non-shield part, that is, 1 block (1 unit), may form a transmissive part with a predetermined area;

FIG. 19A to FIG. 19C are schematic views for describing the duty ratio, that is, (light-blocking area)/(light-transmissive area), in the mark pattern shown in FIG. 18;

FIG. 23A and FIG. 23B are enlarged photographs showing examples of results, which are obtained when light with a fluence of 1100 mJ/cm$^2$ was radiated on semiconductor films on the same substrate in the same fabrication step, on the basis of the principle that is explained with reference to FIGS. 21A and 21B and FIG. 22;

FIG. 24 is an enlarged photograph of an area "A" in FIG. 23A;

FIG. 25 is a view for explaining an example of the result that was obtained when a mark was formed on the semiconductor film on the substrate using the pattern shown in FIG. 23A and a light signal from the mark was detected by a detector of a well-known photolithography apparatus;

FIG. 26 is a schematic view for describing an example of a mark pattern (phase modulation element) that is used in the crystallizing apparatus shown in FIG. 10;

DETAILED DESCRIPTION OF THE INVENTION

First Embodiment

A first embodiment of the present invention will now be described with reference to FIG. 1A to FIG. 1E. To begin with, a support substrate 11 that is formed of an insulating material, such as a glass substrate, a quartz substrate or a plastic substrate, is prepared. Using the support substrate 11, a semiconductor film formation substrate 10, which includes the support substrate 11 and a semiconductor film 13 lying over the support substrate 11, is to be fabricated. In a case where the present invention is applied to, e.g. a liquid crystal display, it is advisable to use a no-alkali glass substrate of, e.g. Corning #1737, as the support substrate 11. The material of the support substrate 11 in this invention is not limited to insulating materials. Where necessary, semiconductor substrates of, e.g. Si, Ge, SiGe, SiGeC, GaAs, GaP, InAs, GaN, ZnTe, CdSe or CdTe may be usable.

An insulating film 12 with a thickness of, e.g. about 500 nm, which serves as an undercoat layer, is formed on the support substrate 11. The insulating film 12 is formed of, e.g. an $SiO_2$ film. The $SiO_2$ film may be formed by CVD, such as plasma chemical vapor deposition or low-pressure chemical vapor deposition, or by sputtering. The insulating film 12 that serves as the undercoat layer of the semiconductor film 13 prevents diffusion of desirable impurities from the support substrate 11 of, e.g. glass into the semiconductor film 13 on the insulating film 12. In addition, the insulating film 12 has a heat accumulation effect for accumulating heat that is produced in the semiconductor film 13 at the time of melting and recrystallizing the semiconductor film 13. The insulating film 12 may be formed of a stacked-layer structure (not shown) such as a combination of a SiN film and an $SiO_2$ film, instead of the single $SiO_2$ film.

Next, an amorphous or polycrystalline semiconductor film 13 is formed on the insulating film 12 by a conventional film-formation technique of CVD, such as plasma chemical vapor deposition or low-pressure chemical vapor deposition, or sputtering. For example, a silicon thin film can be formed on the $SiO_2$ film by thermal decomposition of monosilane $SiH_4$. In this case, in the normal film-formation temperature range of 600° C. to 700° C., a polycrystalline layer in which a single-crystal portion has a grain size of about 20 nm is formed. In the temperature range below about 500° C., an amorphous film is formed. The semiconductor film 13, which is used here, is a silicon thin film having a thickness of about 30 to 200 nm, preferably about 50 to 100 nm.

In the present invention, the semiconductor film 13 is not limited to the silicon thin film. A physically proper semiconductor film, such as a Ge, SiGe or SiGeC thin film, is usable. In usual cases, the semiconductor film 13 is formed over the entire surface of the insulating film 12.

Figure 1:
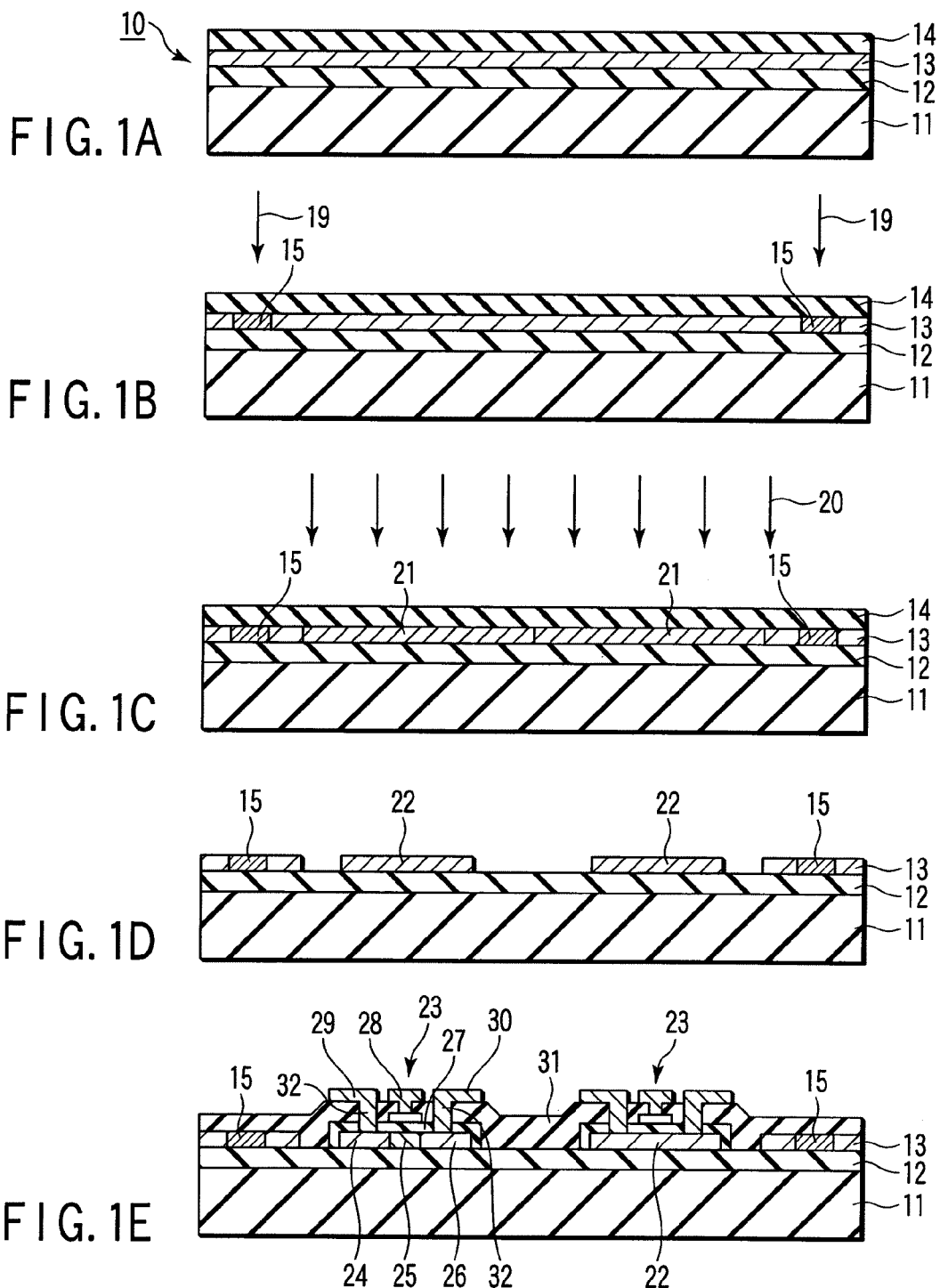
FIG. 1A to FIG. 1E illustrate fabrication steps according to a first embodiment of the present invention.

Subsequently, as shown in FIG. 1A, a protection film 14 with a thickness of about 300 nm, which serves as a so-called cap film, is formed on the entire surface of the semiconductor film 13. For example, an $SiO_2$ film, an SiN film, an SiON film, an $SiO_x$ (x=1 or 2) film, or a stacked-layer structure thereof, is usable as the protection film 14. The insulating film 12 and protection film 14 have heat accumulation effects for accumulating heat that is produced in the semiconductor film 13.

After the dehydrogenation process, an alignment mark 15 for aligning a recrystallized region in a phase-modulation excimer laser crystallization method (to be described later) is formed in a part of the semiconductor film 13 by laser crystallizing method. The alignment mark 15 is also usable in a step of forming a thin-film transistor after the recrystallization.

Figure 8A:
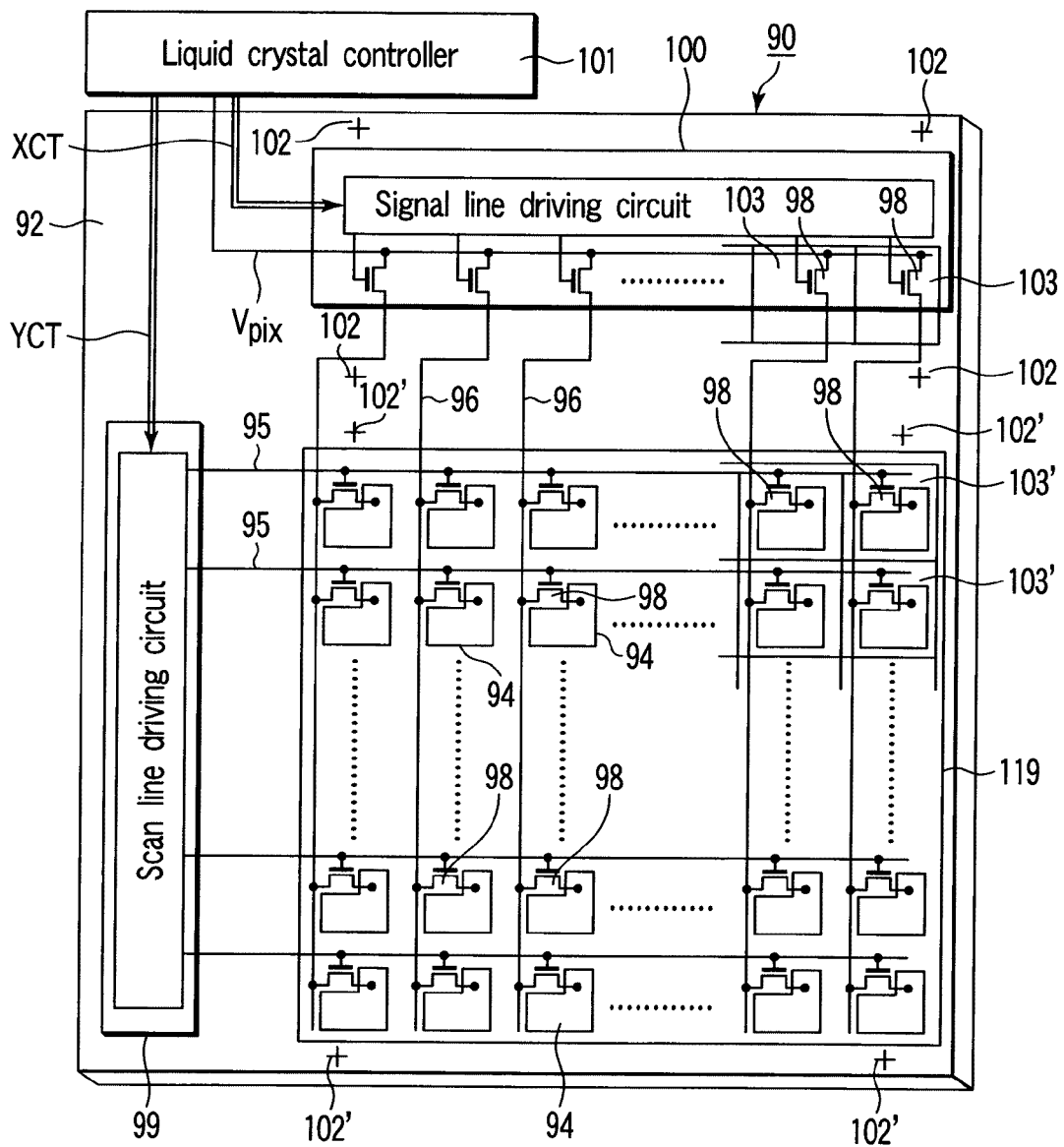
FIG. 8A and FIG. 8B show a concrete example of a liquid crystal display that uses a semiconductor thin-film that is formed according to the present invention.
Figure 8B:
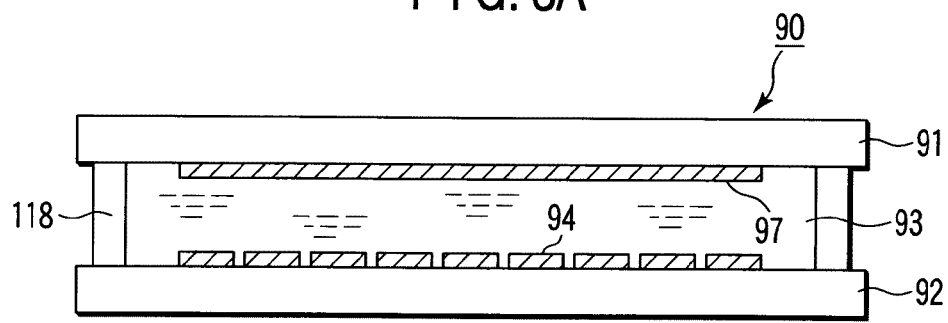
Figure 9:
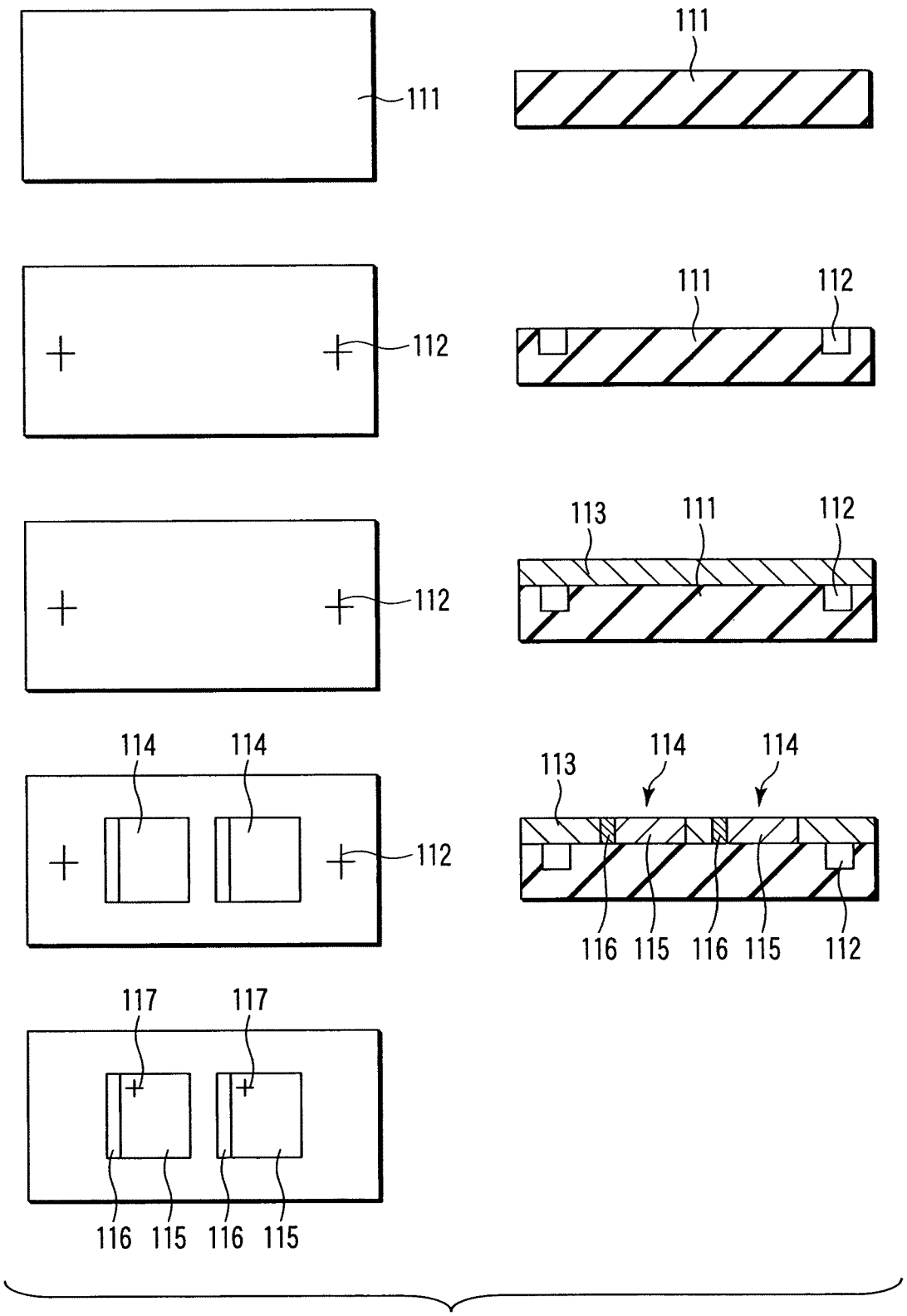
FIG. 9 illustrates a crystallizing method for a semiconductor film in the prior art.

In addition, the alignment mark can be used for alignment in a step of attaching substrates 91 and 92 via a frame-shaped seal member 118 when a liquid crystal display is assembled (see FIG. 8B). Furthermore, the alignment mark can be used for alignment in a dicing step of dividing, for instance, a substrate 61 shown in FIG. 6, into smaller substrates. Besides, in a step of forming a semiconductor device, such as a thin-film transistor, in the semiconductor film, the alignment mark can be used as a reference for determining the position of a lithography mask. In the initial laser irradiation process, it is possible to additionally form alignment marks that are necessary for lithography in subsequent thin-film transistor fabrication steps.

Figure 2:
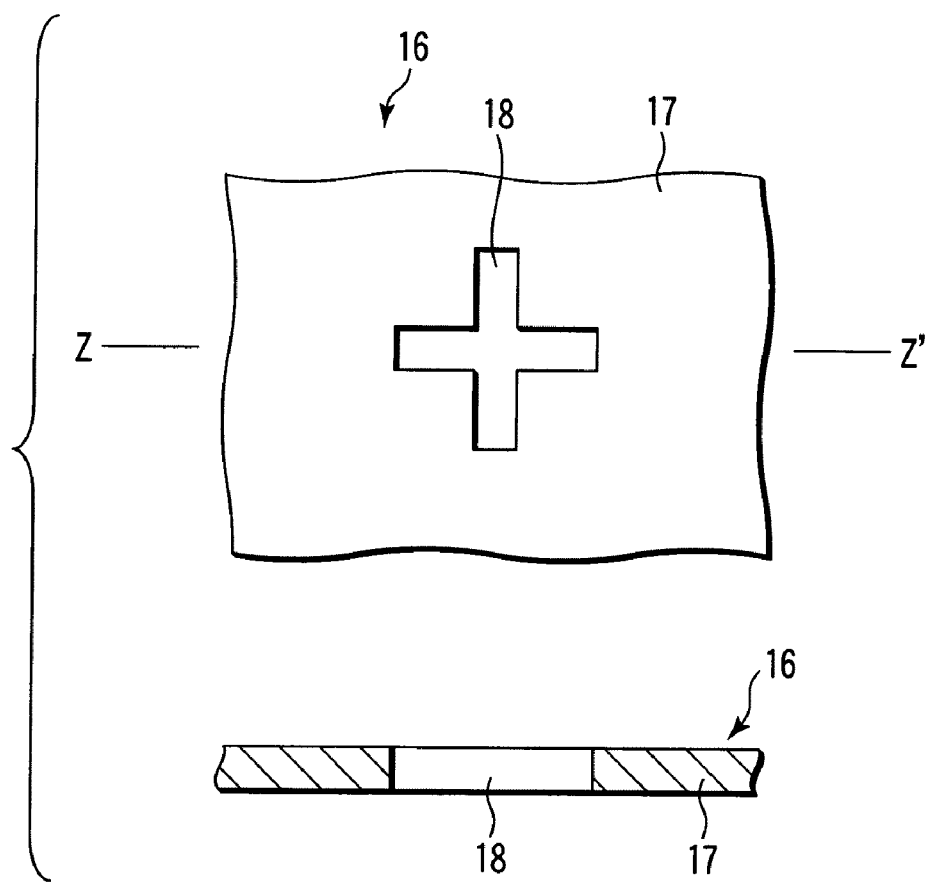
FIG. 2 shows a concrete example of a mask for forming an alignment mark in the present invention.

The alignment mark 15 is formed by irradiation of a laser beam 19 using a mask or a phase shifter 16 (hereinafter also referred to as an alignment mark forming mask or shifter) for forming the alignment mark, as shown in FIG. 2. The laser irradiation at this time is referred to as "first laser irradiation". Preferably, the laser beam should be a homogenized beam with a two-dimensionally uniform light intensity.

The alignment mark forming mask 16 may be configured such that an opening 18 for determining the shape of the alignment mark is formed in a metal thin plate 17 such as a chromium thin film with a thickness of 300 nm to 500 nm or an aluminum thin film with a thickness of 300 nm to 400 nm. The laser bean that is vertically incident on the support substrate 11 passes through the opening 18 and reaches the semiconductor film 13. The laser beam heats the semiconductor film 13 in a shape corresponding to the shape of the opening 18, and forms a thermal-metamorphic region in the semiconductor film 13. The thermal-metamorphic region has optical characteristics that are different from those of a non-heated region, so the former is optically discriminable from the latter.

In the case of using the alignment mark forming mask 16 shown in FIG. 2, the alignment mark has a cross shape. The shape of the alignment mark is not limited to the cross shape. The light-blocking material of the mask is not limited to the metal thin plate that reflects the laser beam, and it may be a material that absorbs the laser beam, such as a silicon nitride film. Alternatively, a phase shifter that locally modulates the irradiation intensity of the laser beam is usable. When the phase shifter is used, the mark part is composed of two or more irradiated regions with different light intensities.

In the case of using the alignment mark forming mask or shifter 16 as shown in FIG. 2, an excimer laser apparatus, which is applicable to a phase-modulation excimer laser crystallization method to be described later, may be used for the purpose of simplicity in the manufacturing apparatus and fabrication process. In this case, it is preferable to successively execute the step of forming the alignment mark 15 and the recrystallization step to be described later. In a case where the thermal-metamorphic alignment mark 15 is to be formed in the amorphous or polycrystalline silicon thin film 13, it is preferable to use a fluence of, e.g. about 0.3 $J/cm^2$, in order to ensure exact outlines and optical differences relative to neighboring parts. For example, a XeCl (wavelength: 248 nm) or a KrF (wavelength: 308 nm) may be used an excimer laser source that is commonly usable in the recrystallizing step (to be described later).

Subsequently, as illustrated in FIG. 1C, the phase-modulation excimer laser crystallization method, which is to be described later in detail, is usable. An excimer laser beam 20 having a light intensity distribution, for example, as shown in FIG. 3B, is radiated on the surface of the protection film 14. This laser irradiation is referred to as "second laser irradiation". In the second laser irradiation, the position of irradiation of the laser beam is set on the basis of the alignment mark 15 that is formed in advance in the semiconductor film 13 by the first laser radiation. The dimensions and shape of a region, where the second laser irradiation is effected, are, for example, 2 mm in each side of a rectangle. Thus, in usual cases, the position of irradiation is scanned over the support substrate 11 with reference to the alignment mark 15. By successively irradiating a plurality of regions, the plural regions can be recrystallized in a matrix. By this method, a large-area crystallized region can be formed. In the second laser irradiation, the semiconductor film needs to be melted. Thus, the second laser irradiation requires a higher energy density than the first laser irradiation. For example, a laser beam with a fluence of about 0.7 to 1.0 J/cm$^2$ is used.

By the second laser irradiation using the second laser beam 20, most of the laser-irradiated region of the semiconductor film 13 becomes a large-grain-sized crystallized region 21. Thus, the excimer laser beam 20 having a proper light intensity distribution as shown in, e.g. FIG. 3B, is radiated, and a temperature distribution is imparted to the semiconductor film 13. The large-grain-sized crystallized region 21 is formed such that the semiconductor film 13, which is heated above the melting point, is gradually crystallized from the low-temperature part toward the high-temperature part. At a low-temperature position with a low laser beam intensity, polysilicon (poly-Si) or microcrystal silicon (μc-Si) is initially formed. However, with the crystal growth according to the temperature gradient, the growth of a crystal grain that tends to easily grow is facilitated, and a large-grain-sized crystallized region is formed. In the recrystallized region, a large-area crystal grain, which is enough to form, e.g. a channel portion of a thin-film transistor, is obtained.

As illustrated in FIG. 1D, the semiconductor film 13 is partly etched, and mutually electrically insulated semiconductor islands 22, where thin-film transistors, for instance, are to be formed, are formed. In the case where the alignment mark 15 is used in the step of fabricating, e.g. the thin-film transistor, the region of the alignment mark 15 can be left without etching, as shown in FIG. 1D. If the alignment mark 15 is not used in a subsequent fabrication step, the alignment mark 15 may be removed. In the island 22, at least an active region, i.e. a channel region, of the thin-film transistor is disposed within the large-grain-sized recrystallized region.

FIG. 1E is a cross-sectional view showing, as concrete examples of electronic devices, two thin-film transistors 23 that are formed in two islands 22 and have the same structure. A conventional thin-film transistor fabrication method is applicable to the formation of these thin-film transistors 23.

In FIG. 1E, a source region 24, a channel region 25 and a drain region 26 of the thin-film transistor 23 are formed in the associated island 22. A gate insulation film 27 of, e.g. SiO$_2$ is formed on the surface of the channel region 25. A gate electrode 28 is formed on the gate insulation film 27. In usual cases, the support substrate 11 and thin-film transistor 23 are covered with an insulating protection film 31 of, e.g. SiO$_2$. A source electrode 29 and a drain electrode 30 are led out from the source region 24 and drain region 26 via through-holes 32. In this example, thin-film transistors are formed. However, needless to say, electrical components other than the thin-film transistors, such as capacitors, diodes and pixel electrodes of liquid crystal display panels, can be formed in the islands 22.

Figure 4:
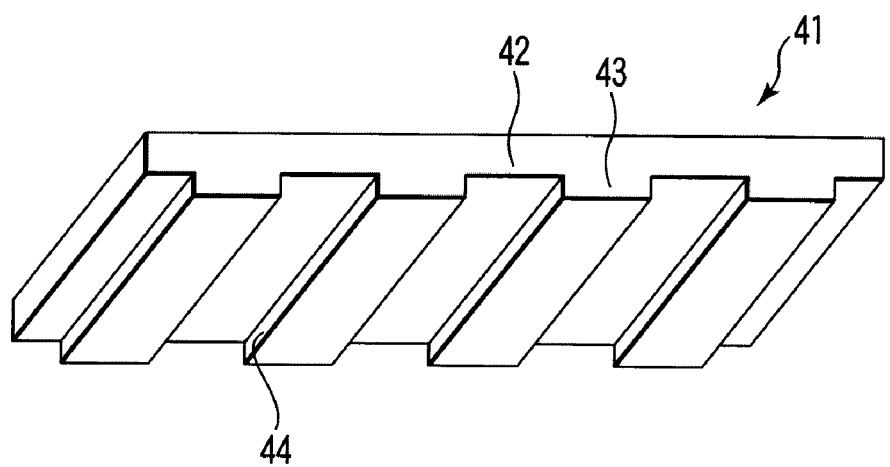
FIG. 4 is a perspective view of a phase shift mask that is usable in the present invention.

Referring now to FIG. 3, the phase-modulation excimer laser crystallization method that is used in this embodiment is described. A phase shifter, for example, as shown in FIG. 3A, is used in the phase-modulation excimer laser crystallization method of this embodiment. FIG. 3A shows a cross section of the phase shifter 41. The phase shifter 41 is formed by providing a transparent base material, e.g. quartz base material, with neighboring regions 42 and 43 having different thicknesses. FIG. 4 is a perspective view of the phase shifter 41. At a stepped portion 44 formed at the boundary between the two regions 42 and 43, a so-called phase shift part is formed, where an incident excimer laser beam 45 can be diffracted or interfered. Thus, the incident excimer laser beam with uniform light intensity can be provided with a cyclically varying spatial distribution.

The phase shifter 41 in this embodiment is configured to have the stepped portion 44 that imparts opposite phases (180° phase difference) to the laser beams that have passed through the neighboring patterns 42 and 43. In other words, the alternately arranged regions 42 and 43 comprise a first strip region 42 and a second strip region 43, and the phases of laser beams that are incident in phase are varied such that the laser beam that emerges from the first strip region 42 of the phase shifter has a phase of, e.g. π, and the laser beam that emerges from the second strip region 43 of the phase shifter has a phase of 0.

In this embodiment, the phase shifter 41 is formed of a rectangular substrate with a refractive index of 1.508. Each of the first and second strip regions 42 and 43 has a width of 25 μm in the horizontal direction. The degree of a step Δt between the strip regions 42 and 43 corresponds to the phase difference θ between the emerging laser beams. The phase difference θ is given by θ=2πΔt (n—1)/λ, where λ is the wavelength of the laser beam, and the n is the refractive index of the quartz substrate. For example, in the case where the KrF excimer laser with the wavelength of 248 nm is used, the refractive index is 1.508. When the step Δt is 244 nm, the phase difference between the transmissive beams is 180°. Thus, the phase shifter 41 can be formed by selectively etching that part of the planar quartz substrate, which corresponds to the strip region 42, by a depth of 244 nm. The region, which is thinned by the etching, is the first strip region 42, and the non-etched region is the second strip region 43.

When the phase shifter 41 with this structure is used, a laser beam intensity distribution 46 as shown in FIG. 3B is obtained. In the semiconductor film 13 that is irradiated with the laser beam having the intensity distribution 46, a part 55 with a minimum light intensity has a lowest temperature. The semiconductor film 13 has a cyclic temperature distribution 47 based on the laser beam intensity distribution 46. Normally, the intensity and irradiation time of the laser beam are selected so that the semiconductor film 13 may be melted even at the part 55 with the minimum light intensity and a proper temperature gradient may be obtained.

If the radiation of the laser beam 45 is stopped, the temperature of the semiconductor film 13 in the part with the minimum light intensity, that is, lowest-temperature parts 48, 48' and 48" or regions in the vicinity of these parts, falls below the melting point, and crystallization begins. At this time, many polycrystals, which function as seeds for recrystallization of the semiconductor film, occur. Specifically, microcrystals or polycrystals first form in the lowest-temperature parts 48, 48' and 48". However, while the crystals are successively growing from the low-temperature part at a temperature gradient part 49, the growth of crystal portions with crystal orientations that are particularly suited to crystal growth is facilitated. Accordingly, a plurality of relatively large crystal grains can be obtained at each temperature gradient part 49. Subsequently, large-grain-sized recrystallized regions, which match with the dimensions of the active region of the thin-film transistor, are formed.

Figure 3A:
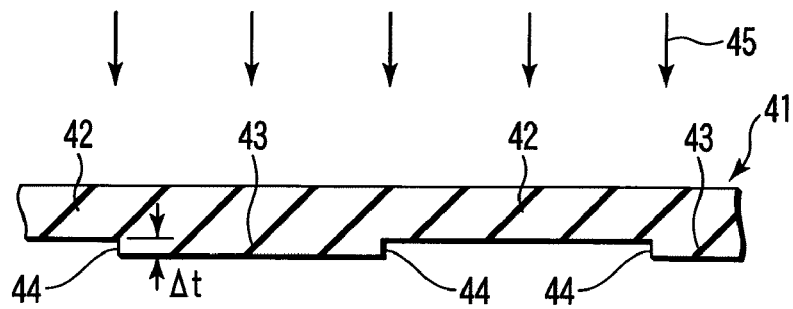
FIG. 3A to FIG. 3D are views for explaining a phase-modulation excimer laser crystallization method that is employed in the present invention.
Figure 3B:
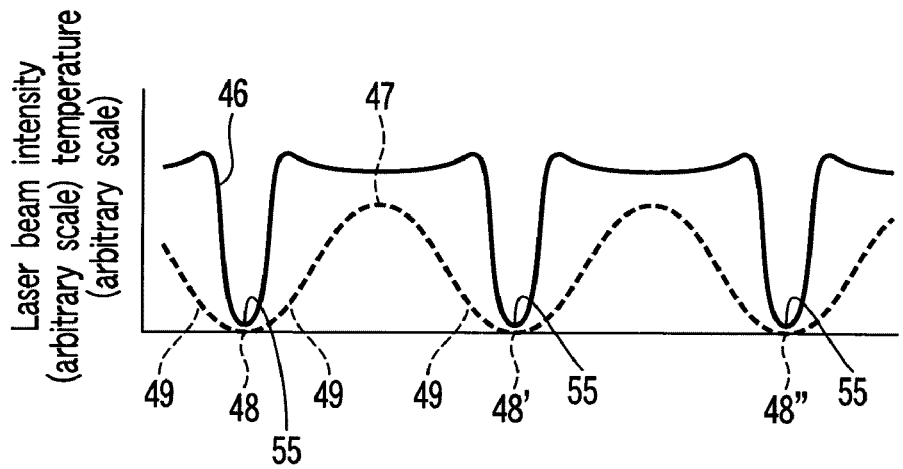

In the above-described embodiment, as shown in FIG. 3A and FIG. 4, the phase shifter 41 is configured such that linear phase shift parts that are formed of the stepped portions 44 are arranged in parallel. The structure of the phase shift, however, is not limited to this.

For example, as shown in FIG. 5A, an area-modulation type phase shifter, in which stepped portions 44 with different areas are arranged in a matrix, may be used. Specifically, the area-modulation type phase shifter is a mask in which the ratio in area of the stepped portions 44 is modulated so as to obtain a light intensity distribution shown in FIG. 5B. In FIG. 5A, symbol W denotes a repetition length of the phase shifter, and Δt is the degree of the step. In FIG. 5B, BP is a beam profile, PH is an amplitude of the beam profile, PW is a pitch width of the beam profile, and θ is the angle between mutually opposed inclined parts of the beam profile.

Figure 3D:
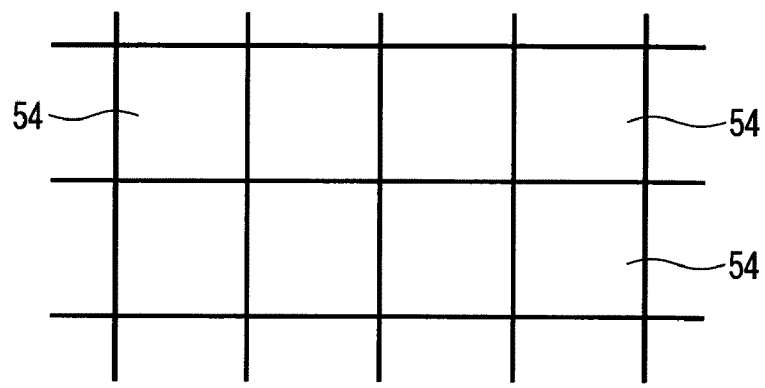
Figure 3C:
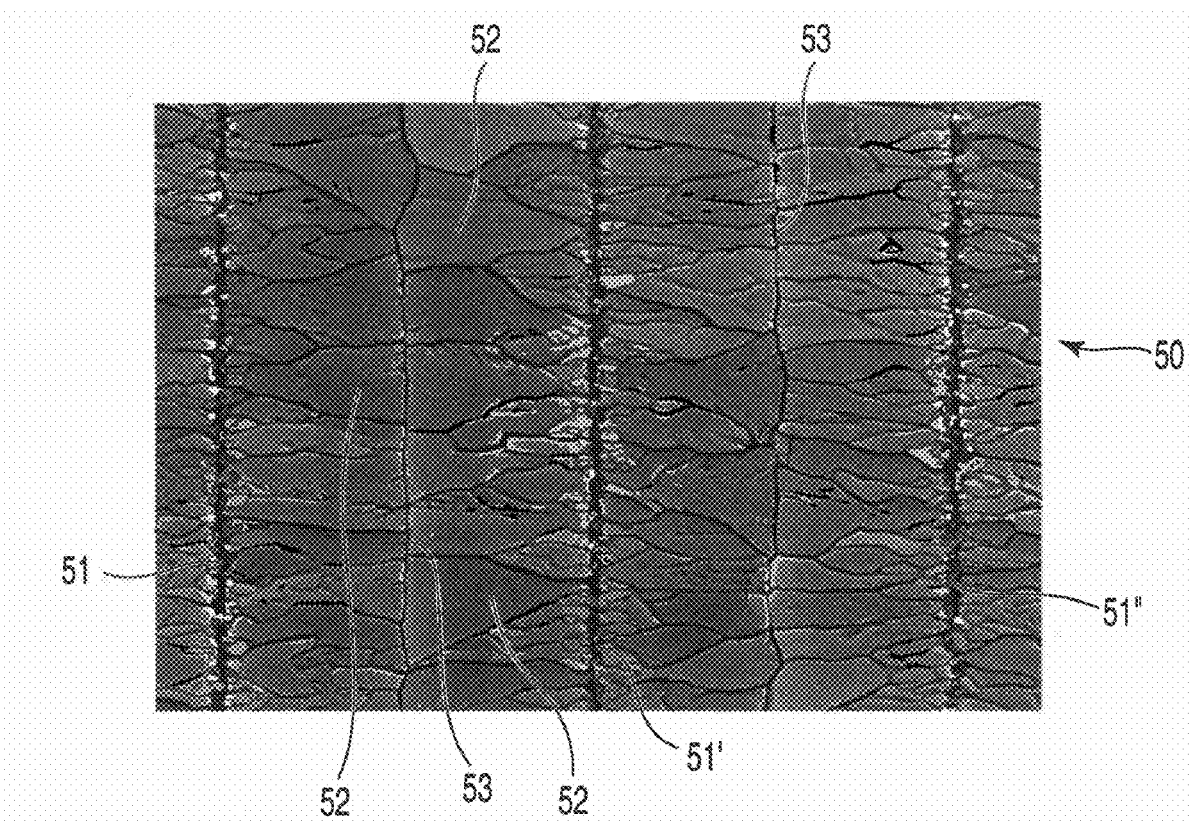

FIG. 3C is a microscopic photograph that shows crystallized semiconductor film 50 that was obtained using the phase shift mask 41 shown in FIG. 3A. Polycrystal regions 51, 51' and 51" are vertically formed at positions corresponding to the lowest-temperature parts 48, 48' and 48" of the phase shift mask 41. Crystals are grown from the polycrystal regions 51, 51' and 51" in the transverse direction into large single crystals with a grain size of about 2.5 μm. The crystal growth ends at middle parts between the transversely neighboring polycrystal regions 51, 51', 51". Vertical grain boundaries 53 occur at the middle parts. By properly selecting the temperature gradient, still larger crystal portions 52 can be obtained. Large-grain-sized crystallized regions can be formed adjacent to the polycrystal regions 51, 51' and 51".

FIG. 3D shows an example of device formation blocks 54 corresponding to the crystallized semiconductor film 50 shown in FIG. 3C. For example, the thin-film transistor 23 or the channel region 25 of thin-film transistor 23 is formed in the large-grain-sized crystallized region within each device formation block 54.

Figure 6A:
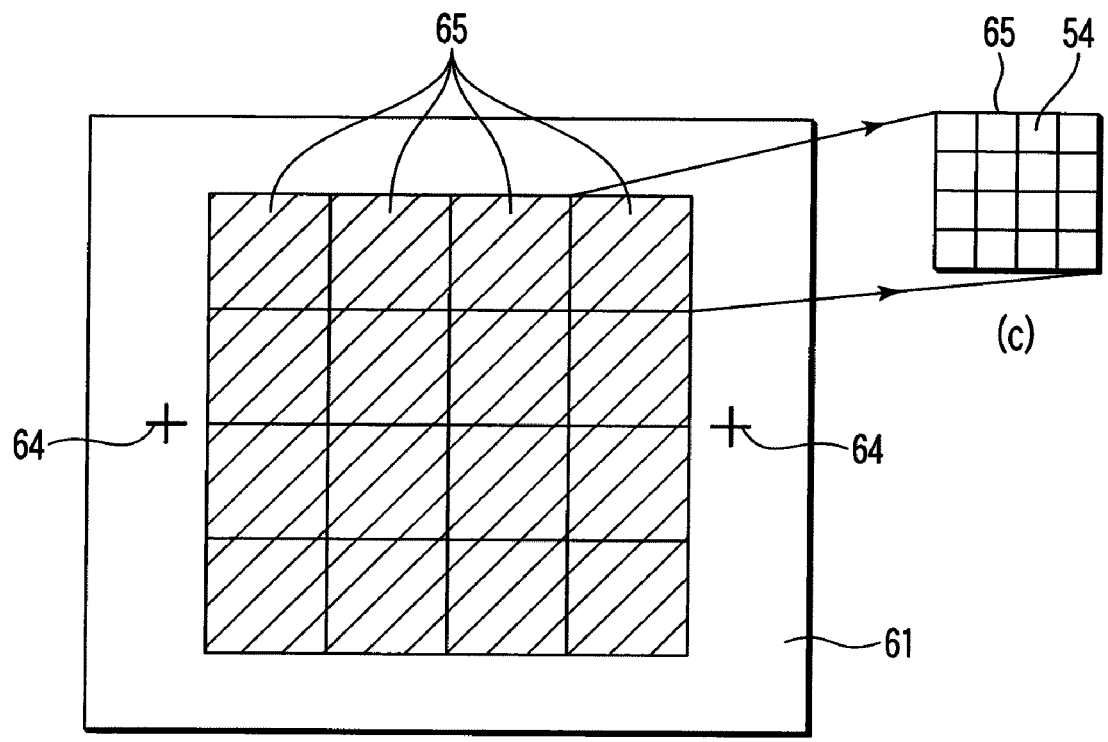
FIG. 6A and FIG. 6B show the state in which many device formation regions are formed on a large-area insulating substrate in the first embodiment of the invention.
Figure 6B:
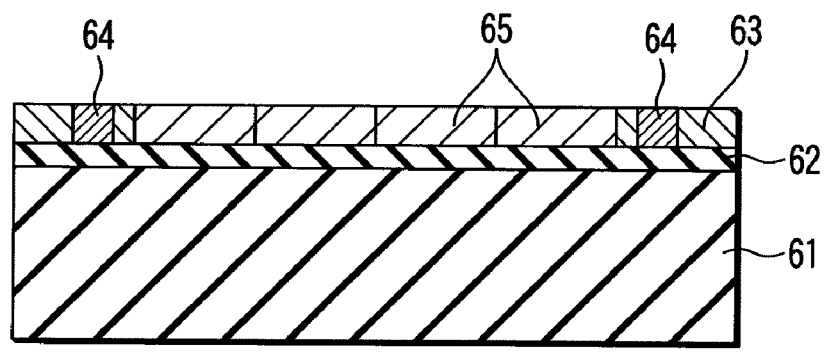

FIG. 6 shows a concrete example in which many device formation blocks 54 are formed on a large-area insulating substrate 61. For example, an SiO$_2$ film 62, which serves as an undercoat layer, is formed on the insulating substrate 61 that is formed of, e.g. a no-alkali glass substrate. An amorphous or polycrystalline silicon film 63 is formed on the SiO$_2$ film 62. An alignment mark 64 is first formed in the silicon film by the first laser irradiation.

Subsequently, a plurality of crystallized regions 65 are formed. Each crystallized region 65 can be formed by the second laser irradiation each time an XY table, for instance, on which the insulating substrate 61 is mounted, is moved at predetermined intervals. For example, each time the second laser irradiation is effected, the alignment for laser irradiation can be performed on the basis of the alignment mark 64 formed on the semiconductor film. Thus, the crystallized regions 65 can exactly be positioned on the insulating substrate 61. Each crystallized region 65 includes a plurality of device formation blocks 54. The alignment mark 64 is also usable in the process steps of fabricating, e.g. the thin-film transistor, such as the step of forming the islands 22 illustrated in FIG. 1D. Further, the alignment mark 64 is usable in the steps of dicing and attaching substrates.

Figure 7:
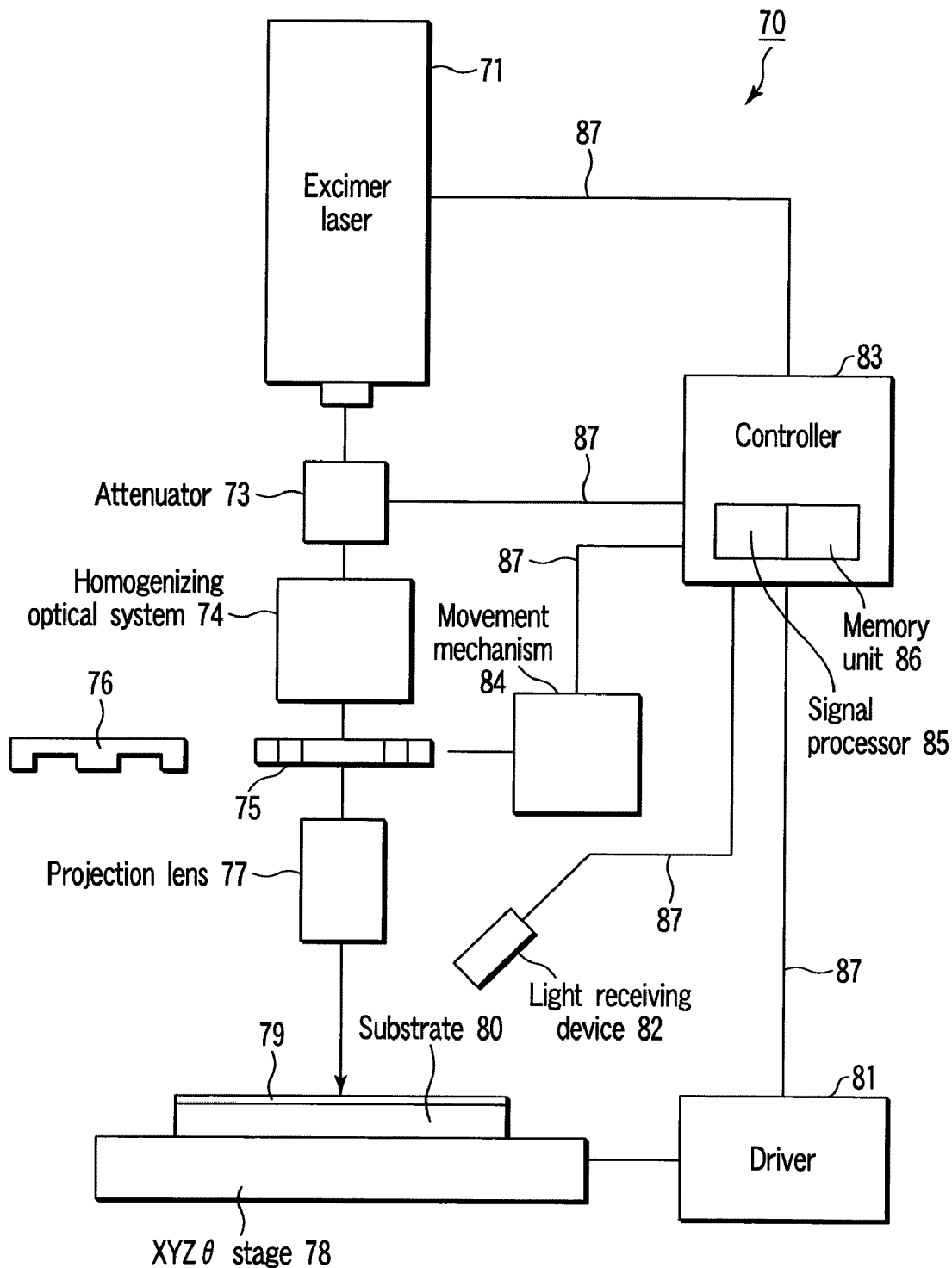
FIG. 7 shows a concrete example of a crystallizing apparatus for a semiconductor film, which is usable in the present invention.

FIG. 7 shows an embodiment of a crystallizing apparatus 70 that is usable in the crystallization of the semiconductor film according to the present invention. In this example, an excimer laser 71 (e.g. XeCl, KrF, etc.) is used as a laser light source. The laser light source, however, is not limited to such an excimer laser. As is shown in FIG. 7, on the emission side of the excimer laser 71 that emits a pulse laser beam 72, there are successively provided an attenuator 73 for controlling the energy density of the laser beam 72 and a homogenizing optical system 74 for homogenizing the intensity of the laser beam. The attenuator 73 and homogenizing optical system 74 are ordinary ones that are used in conventional optical apparatuses.

An alignment mark forming mask or shifter 75, or a phase shifter 76, is disposed on the emission side of the homogenizing optical system 74. First irradiation (normally several times) using the alignment mark forming mask or shifter 75 is followed by second irradiation (normally several times) using the phase shifter 76. A movement mechanism 84, which is generally used for replacement of components, may be used as a mechanism for replacement between the alignment mark forming mask or shifter 75 and the phase shifter 76. By the movement mechanism 84, the alignment mark forming mask or shifter 75 and the phase shifter 76 are changed. A laser beam pattern, which is formed by the alignment mark forming mask or shifter 75 or the phase shifter 76, is passed through a projection lens 77 with an unchanged size or with a reduced or increased size.

An XY stage 78 that is movable in a direction perpendicular to the direction of travel of the laser beam, or an XYZθ stage 78 (a stage that is movable in X, Y and Z directions perpendicular to one another and is capable of rotating a substrate in the XY plane by a desired angle θ) is disposed on the emission side of the projection lens 77. An insulating substrate 80, on which a semiconductor thin film 79 is formed, is to be placed on the XYZθ stage 78 or the like. The XYZθ stage 78 is connected to a driver 81 and is moved by the driver 81 in a direction perpendicular to the direction of the laser beam. A light receiving device 82 for detecting at least the position of the alignment mark 64 formed on the semiconductor thin film 79 is provided above the XYZθ stage 78.

The excimer laser 71, attenuator 73, movement mechanism 84 for alignment mark forming mask or shifter 75 or phase shifter 76, driver 81 and light receiving device 82 are electrically connected to a controller 83 over signal lines 87. The controller 83 controls signals from the components 71, 73, 84, 81 and 82. The controller 83 includes a signal processor 85 that generates control signals necessary for the components 71, 73, 84, 81 and 82, and a memory unit 86 that stores information and programs, which are necessary for signal processing.

The controller 83 includes a program that enables at least formation of an alignment mark at a predetermined position on an amorphous or polycrystalline semiconductor film by first laser irradiation, and formation of recrystallized regions with large grain sizes by second irradiation with the alignment based on the alignment mark. The controller 83 can execute various controls that are necessary for the recrystallizing apparatus, including a light emission control of the excimer laser 71 that emits a pulse laser beam, an energy density control of the attenuator 73 in the first irradiation and second irradiation, a mask/shifter replacement control using the mask/shifter movement mechanism 84, a driving control of the XYZθ stage 78 by means of the driver 81, and a position detection control for the alignment mark 64 and the semiconductor thin film 79 by means of the light receiving device 82.

FIG. 8A and FIG. 8B show an embodiment of a liquid crystal display that is manufactured using a recrystallized semiconductor thin film with an alignment mark formed in the semiconductor thin film. Reference numeral 102 designates alignment marks that are formed on a signal line driving circuit part 100 provided on an upper part of a liquid crystal display 90. Numeral 102' denote alignment marks that are formed on a lower-side display part 119. Device formation regions corresponding to the device formation blocks 54 shown in FIG. 6 are denoted by numerals 103 and 103'. For simple depiction, only the upper right part is shown, and the other part is omitted. In this embodiment, the alignment marks are located at the four corners of the driving circuit part and the display part. However, the number and arrangement of alignment marks can properly be determined in accordance with the number and arrangement of device formation regions.

As is shown in FIG. 8B, the liquid crystal display 90 includes a pair of upper and lower transparent substrates 91 and 92, a liquid crystal layer 93, a plurality of pixel electrodes 94 and a counter-electrode 97. In addition, as shown in FIG. 8A, the liquid crystal display 90 includes a plurality of pixel electrodes 94 arranged in a matrix, a plurality of scan lines 95, a plurality of signal lines 96, and a plurality of thin-film transistors 98 that are connected to the pixel electrodes 94.

The paired transparent substrates 91 and 92 may be formed of, e.g. glass substrates. The transparent substrates 91 and 92 are bonded to each other via a frame-shaped seal material 118. The liquid crystal layer 93 is sealed in the region that is surrounded by the paired transparent substrates 91 and 92 and the seal material 118.

On the inner surface of one of the paired transparent substrates 91 and 92, for example, on the inner surface of the lower substrate 92, there are provided a plurality of pixel electrodes 94 arranged in a matrix in row and column directions, a plurality of thin-film transistors 98 connected to the associated pixel electrodes 94, and a plurality of scan lines 95 and signal lines 96 that are electrically connected to the thin-film transistors 98. In this embodiment, the thin-film transistors 98 and pixel electrodes 94 are formed on the recrystallized device-formation regions 103 and 103'.

The scan lines 95 extend in the row direction and are connected to the gates of the thin-film transistors 98. The scan lines 95 are connected at one end to a scan line driving circuit 99. The signal lines 96 extend in the column direction and are connected to the thin-film transistors 98. The signal lines 96 are connected at one end to a signal line driving circuit 100. The scan line driving circuit 99 and signal line driving circuit 100 are connected to a liquid crystal controller 101. The liquid crystal controller 101 receives image signals and sync signals from outside, and generates a pixel video signal Vpix, a vertical scan control signal YCT and a horizontal scan control signal XCT.

In the embodiment shown in FIGS. 8A and 8B, the semiconductor film in which the thin-film transistors 98 are formed is provided on the transparent substrate 92, and the alignment marks 102, 102' are formed at predetermined positions on the semiconductor film by the first laser irradiation. The alignment marks 102, 102' are optically recognized, and the position for crystallization by the phase-modulated excimer laser beam is determined with reference to the alignment marks 102, 102'. The thin-film transistors 98 are formed in the device formation regions 103, 103' that correspond to the device formation blocks 54, for example, as shown in FIG. 3D. The thin-film transistors 98 can be formed by the conventional thin-film transistor fabrication process.

Second Embodiment

Next, a second embodiment is described in detail. In the second embodiment, an alignment mark for alignment is formed on a semiconductor film on a substrate, using a phase value modulation type mask pattern MK, as shown in, for example, FIG. 12A. The technique that is to be described below is applicable to uses other than the formation of alignment marks.

Figure 10:
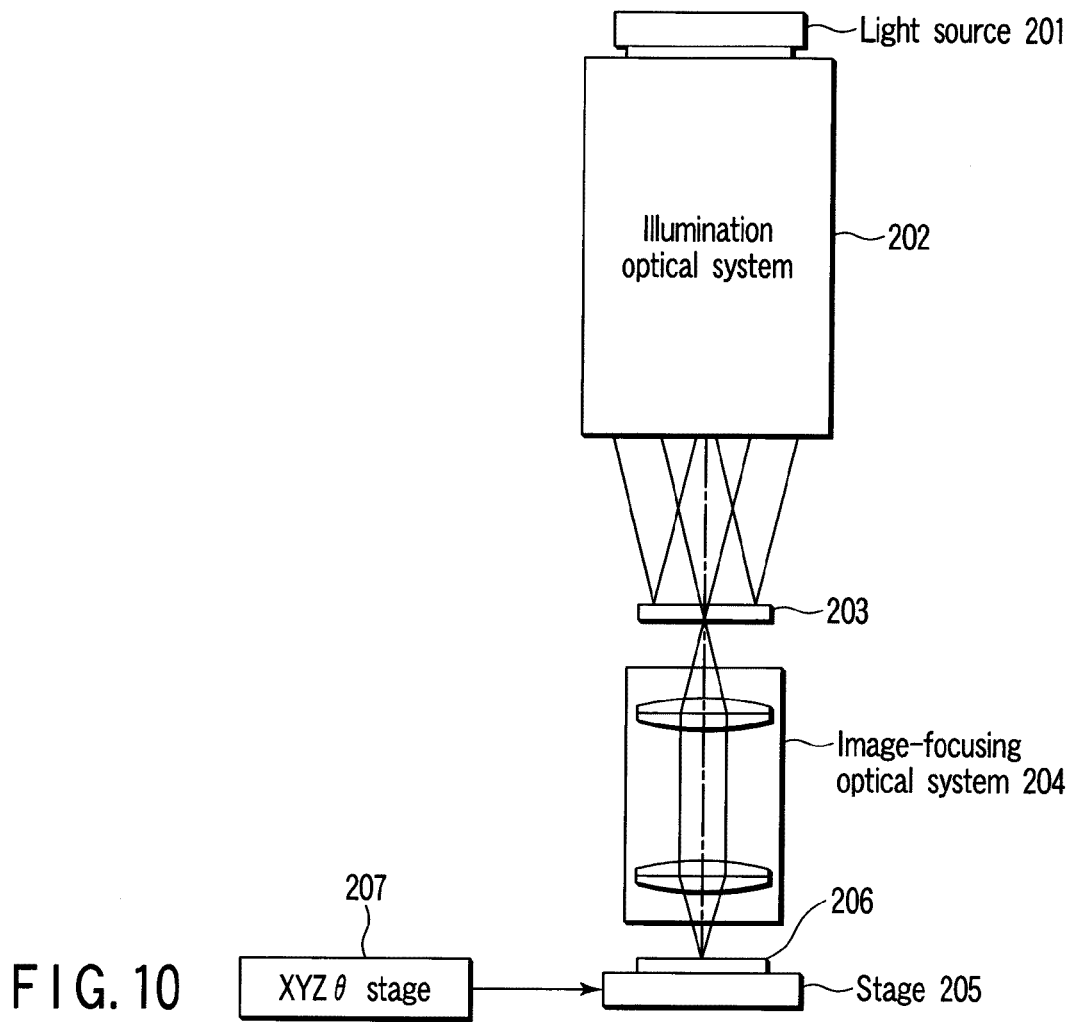
FIG. 10 is a schematic view for describing a concrete example of a crystallizing apparatus, to which second and third embodiments of the invention are applicable.

FIG. 10 schematically shows an example of a crystallizing apparatus that is applicable to the formation of an alignment mark in the second embodiment. A laser beam that is used in the crystallizing apparatus shown in FIG. 10 has a wavelength of, e.g. 248 nm, for heating a non-single-crystal semiconductor film formed on a substrate 206. The crystallizing apparatus may include a KrF excimer laser 201, by way of example, which can output a laser beam capable of melting an irradiated part of the non-single-crystal semiconductor film. As another example, a YAG laser may be used as the light source. Further, a XeCl laser may be used as the light source capable of outputting energy that can heat and melt the non-single-crystal semiconductor film.

The laser beam from the light source 201 is passed through an illumination optical system 202 so that the light intensity in a plane of irradiation perpendicular to the direction of the laser beam may substantially be made uniform.

The illumination optical system 202 includes a homogenizer (not shown). The homogenizer homogenizes the light intensity of the incident laser beam in the plane of irradiation.

The laser beam that is incident on a phase modulation element 203 is provided with a predetermined intensity distribution in the plane of irradiation by the phase modulation element 203. The resultant beam enters an image-focusing optical system 204. The beam, which travels through the image-focusing optical system 204, is converged on a to-be-processed substrate 206 that is held on a stage 205. The substrate 206 held on the stage 205 is irradiated with the laser beam that is provided with the predetermined intensity distribution by the phase modulation element 203, thereby to melt and recrystallize the semiconductor film on the surface of the substrate.

The stage 205 is able to move the substrate 206, as desired, along the plane of exposure under the control of, e.g. an XYZθ controller 207. The plane of exposure, in this context, is defined as a plane at which the illumination light from the image-focusing optical system 204 is focused. Thereby, the illumination light with the light intensity distribution, which comes from the phase modulation element 203, can be radiated on a desired position on the substrate 206. Hence, a predetermined pattern, which is defined depending on the size of the phase modulation element 203, can be radiated at predetermined intervals.

Although details will be described later with reference to FIG. 27, the substrate 206 may be configured such that a non-single-crystal semiconductor film 282 and a cap film 283 are stacked on an insulating substrate 280, such as a glass substrate, via an undercoat protection film 281. The undercoat protection film prevents diffusion of impurities from the glass substrate. Furthermore, the undercoat protection film has an effect for absorbing and accumulating heat that is produced at the time of melting the non-single-crystal semiconductor film. For instance, a silicon oxide film or an organic SOG film is usable as the undercoat protection film. Semiconductor devices such as a semiconductor active device and a semiconductor passive device are formed in the non-single-crystal semiconductor film. The non-single-crystal semiconductor film refers to an amorphous semiconductor film or a polycrystalline semiconductor film. Usable materials of the non-single-crystal semiconductor film include, for instance, SiGe, SiO, CdSe, Te and CdS, as well as silicon. The cap film is formed of a material having a function of absorbing and accumulating heat that is produced at the time of melting the non-single-crystal semiconductor film. A silicon oxide film, for instance, is usable as the cap film.

Figure 11:
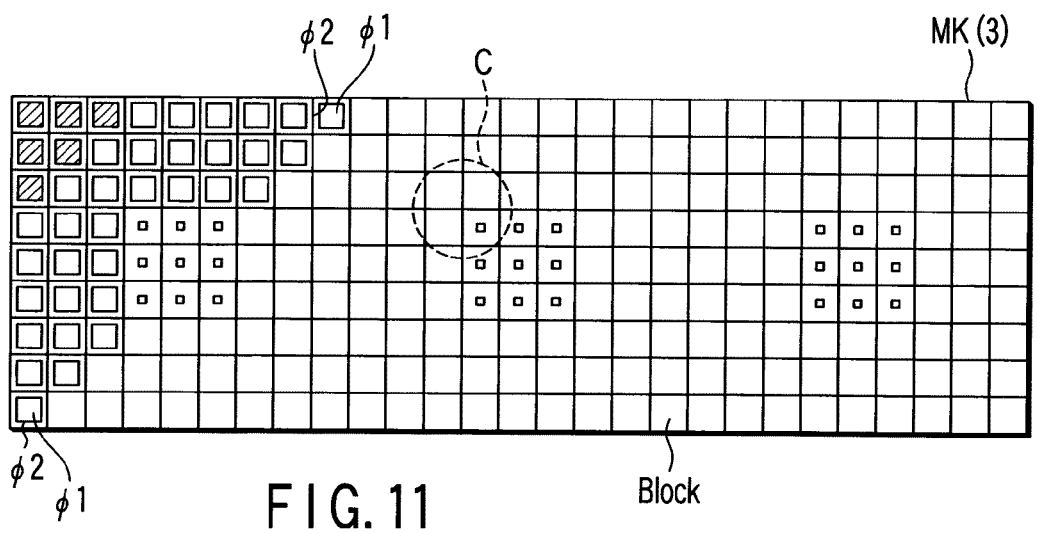
FIG. 11 is a schematic view that shows a concrete example of a mark pattern MK that is usable in the crystallizing apparatus shown in FIG. 10, the mark pattern MK functioning to set the intensity of light from a light source for crystallization at a predetermined value.

FIG. 11 shows an example of the mark pattern that is applicable to the crystallizing apparatus shown in FIG. 10. In the example shown in FIG. 11, the intensity of light emitted from the light source for crystallization can be set at a predetermined lower level in order to form an alignment mark.

The mark pattern MK can mainly provide a phase delay, i.e. a phase difference, to the transmissive light in units of a desired region so that the light may have a predetermined intensity distribution in the state in which the light is focused on an object of image focusing. Alternatively, the mark pattern MK may mainly impart a difference in amount of transmissive light to the transmissive light in units of a desired region so that the light may have a predetermined intensity distribution in the state in which the light is focused on an object of image focusing. The mark pattern MK may be formed in a mesh shape or a dot shape.

In the second embodiment, the mark pattern MK is formed, for example, by selectively etching a substrate that forms the phase modulation element 203, thus providing a difference in thickness (i.e. a stepped portion). Quartz glass is a preferable material of the substrate of the phase modulation element 203. The mark pattern MK can be formed by providing the glass material, preferably quartz glass, of the phase modulation element 203 with stepped portions by mechanical or chemical processing. The mark pattern MK can also be formed by patterning, with a predetermined shape, a film of light transmissive material, which is formed in advance on the substrate of the phase modulation element. In the case where the mark pattern MK is a film of light transmissive material, a predetermined light intensity distribution can be obtained, for example, by controlling the thickness of the film or by varying the area of occupation by the film.

Figure 12A:
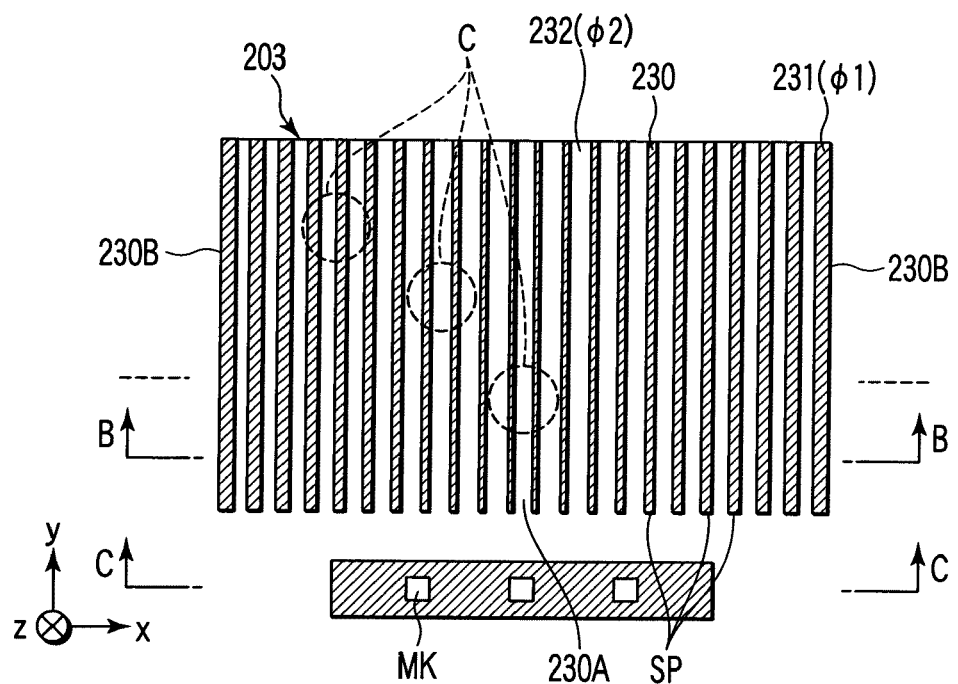
FIG. 12A to FIG. 12C schematically show examples of the mode and degree of variation in intensity of light that passes through the mark pattern shown in FIG. 11.
Figure 12B:
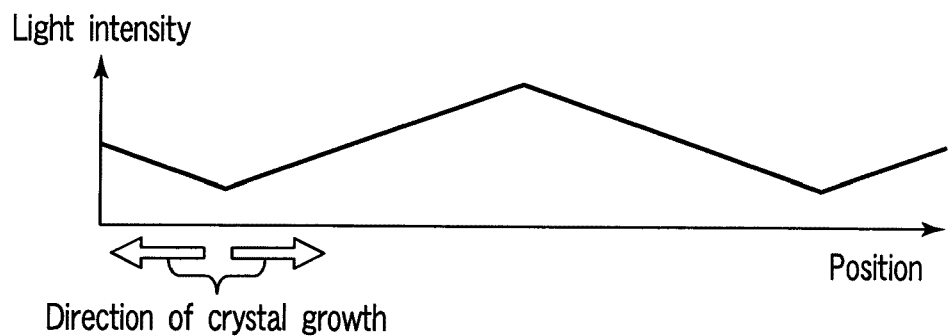
Figure 12C:
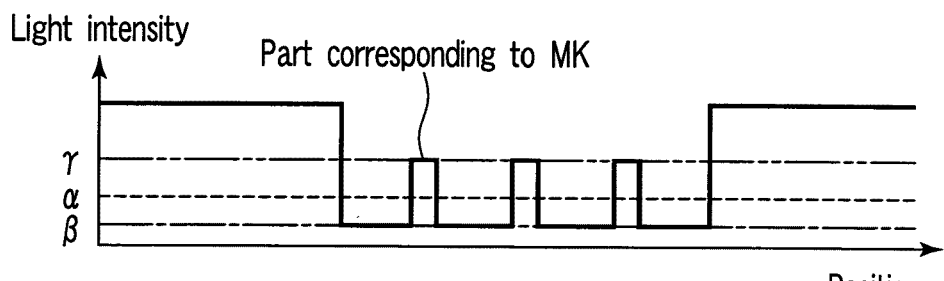

FIGS. 12A to 12C are schematic views for explaining the characteristics of the phase modulation element in which the mark pattern MK shown in FIG. 11 is formed integral with the phase modulating part. FIG. 12A is a plan view that schematically shows the entirety of the phase modulation element in which the mark pattern MK, as described with reference to FIG. 11, is formed integral with the phase modulating part. FIG. 12B and FIG. 12C show light intensity distributions that are obtained when light passes through positions on the phase modulation element, as indicated by line B-B and line C-C in FIG. 12A, respectively.

The ordinate in each of the graphs of FIG. 12B and FIG. 12C indicates the light intensity that is normalized on the basis of the maximum fluence at which crystal growth can be made without ablation in the a-Si film, i.e. the semiconductor film, in the pattern in which large-grain-sized Si crystals are grown in a predetermined direction.

In FIG. 12C, if the intensities of normalized light that has passed through the mark pattern MK are "β" and "γ", the magnitudes of "β" and "γ" are expressed by $$1 > \gamma > \beta,$$

since the mark formation is performed with the fluence for crystallization.

Actually, the value of "γ" is set in consideration of a tolerance relating to a variance in thickness of the a-Si layer on the irradiated object, non-uniformity in thickness of the irradiated object, or a variation in distance between the irradiated object and the irradiation optical system. In other words, the upper-limit value γ of the intensity of light radiated on the part of the mark pattern MK has to be set at a value that can prevent such a situation from occurring that the above-mentioned ablation would occur and the alignment mark formed on the semiconductor film on the substrate in accordance with the mark pattern MK would be lost. The precision in recognition of the alignment mark (the probability that the formed mark pattern MK is left) deteriorates in the region where ablation occurs.

In the meantime, a-Si (amorphous silicon) and p-Si (polysilicon), or c-Si (crystalline silicon), have different refractive indices and are thus optically recognizable. In other words, in order to recognize the mark pattern, it is necessary to form the mark pattern of an a-Si region and a p-Si region or a c-Si region. If the light intensity at which crystallization of a to-be-crystallized semiconductor film begins (i.e. the light intensity necessary for changing the crystal structure) is "α", "β" and "γ" have to satisfy the following conditional formula, $$\gamma > \alpha > \beta \quad (A)$$

In order to achieve the advantageous effect of the invention more satisfactorily, it is preferable to set the lower-limit value β and upper-limit value γ in the conditional formula (A) at optimal values in accordance with the wavelength used, the light intensity, the semiconductor film structure and the light intensity distribution.

The irradiated object is the substrate 206 that is configured such that an $SiO_2$ layer (lower insulating layer) with a thickness of 300 nm is formed on a glass plate with a thickness of, e.g. 0.7 mm, and an a-Si layer with a thickness of 200 nm and an $SiO_2$ layer (upper insulating layer) with a thickness of 300 nm are provided thereon. Assume now that the wavelength λ of light from the light source of the crystallizing apparatus shown in FIG. 10 is 248 nm (KrF excimer laser beam). In addition, assume that the image-focusing optical system 204 is an equal-magnification optical system and the object-side numerical aperture of the image-focusing optical system 204 is 0.031. In addition, the numerical aperture NA of the image-focusing optical system 204 is set at 0.0155 so that the sigma of the illumination system may become 0.5. It is supposed that the phase modulation element 203 is provided with a 180° phase difference.

Experimental results under these conditions are described. The object 206 with the above-mentioned a-Si film was irradiated with an excimer laser beam (wavelength: 248 nm) while the intensity was being varied. Ablation (film destruction) occurred when the peak value of the excimer laser beam with the fluence for crystallization exceeded 1000 mJ/cm². It was thus recognized that the a-Si and p-Si were lost. On the other hand, when the light intensity was 200 mJ/cm² or less, it was confirmed that no crystallization occurred and the a-Si film on the glass substrate remained the a-Si.

It was thus confirmed that when the light intensity was higher than 200 mJ/cm² and not higher than 1000 mJ/cm², the semiconductor film on the glass substrate became into p-Si (polysilicon, or polycrystal) or c-Si (crystalline silicon).

Hence, in the phase modulation pattern for growing a large-grain-sized Si crystal, if the light intensity of the laser beam at which ablation occurs is normalized as "1", the critical value "α" at which crystallization of the a-Si film on the glass substrate begins can be expressed by $$\alpha = 0.2.$$

In this case, the relationship between "β" and "γ" is given by $$\gamma > 0.2 > \gamma.$$

FIGS. 13A to 13D are views for explaining the principle, based on which the intensity of light that is radiated by the image-focusing optical system on the substrate, i.e. the object of processing, can be varied. In general, a light amplitude distribution U (x, y) of an image focused by the phase modulation element 203 is expressed by the equation (B):

$$U(x,y)=T(x,y)*ASF(x,y) \quad (B)$$

In equation (B), T (x, y) is a complex amplitude transmittance distribution of the phase modulation element 203, * indicates convolution (convolution integral), and ASF (x, y) is a point spread function of the image-focusing optical system 204. The point spread function is defined as a point-image amplitude distribution in the image-focusing optical system.

The complex amplitude transmittance distribution T of the phase modulation element 203 is expressed by the following equation (C) since the amplitude is uniform, $$T=T_0 e^{i\phi(x,y)} \quad (C)$$

In equation (C), $T_0$ is a constant value, and $\phi(x, y)$ indicates the phase distribution.

In the case where the image-focusing optical system 204 has a uniform circular pupil and there is no aberration, the following formula (D) is established with respect to the point spread function ASF (x, y), $$ASF(x,y) \propto 2J_1(2\pi/\lambda \cdot NA \cdot r)/(2\pi/\lambda \cdot NA \cdot r) \quad (D)$$

where $r=(x^2+y^2)^{1/2}$

In formula (D), $J_1$ is a Bessel function, $\lambda$ is the wavelength of light, and NA is the image-side numerical aperture of the image-focusing optical system 204, as mentioned above.

To be more specific, the point spread function of the image-focusing optical system 204 shown in FIG. 13A is a light intensity distribution at an image plane 204f of the to-be-processed substrate 206. The light intensity distribution is as shown in FIG. 13B. In FIG. 13B, the abscissa indicates the incidence plane of the substrate 206, and the ordinate indicates the incidence light intensity.

In other words, the point spread function of the image-focusing optical system 204 shown in FIG. 13A can be approximated by a cylindrical shape 204e with a diameter R, which is indicated by a broken line in FIG. 13B. Accordingly, an integration result of the complex amplitude distribution within the circle with a diameter R' (optically corresponding to the diameter R in FIG. 13B) on the phase modulation element 203 shown in FIG. 13C determines the complex amplitude on the image plane 204f shown in FIG. 13A.

As has been described above, the light amplitude, i.e. the light intensity, of the formed image that is focused on the image plane 204f is given by convolution of the complex amplitude transmittance distribution of the phase modulation element 203 and the point spread function.

Consider a case in which the point spread function is approximated by the cylindrical shape 204e. In this case, the complex amplitude transmittance of the phase modulation element 203 is integrated with a uniform weight within a circular point spread range R' shown in FIG. 13C. The result of integration is the complex amplitude on the image plane 204f, and the square of the absolute value thereof is the light intensity.

The point spread range R in the image-focusing optical system 204 is a range defined between intersections 204j between the amplitude curve and the abscissa 204i in FIG. 13B.

Accordingly, the light intensity increases as a variation in phase within the point spread range R becomes smaller. Conversely, the light intensity decreases as the variation in phase becomes larger. This is easier to understand if the sum of phase vectors 204h within a unit circle 204g is considered, as shown in FIG. 13D.

Figure 14C:
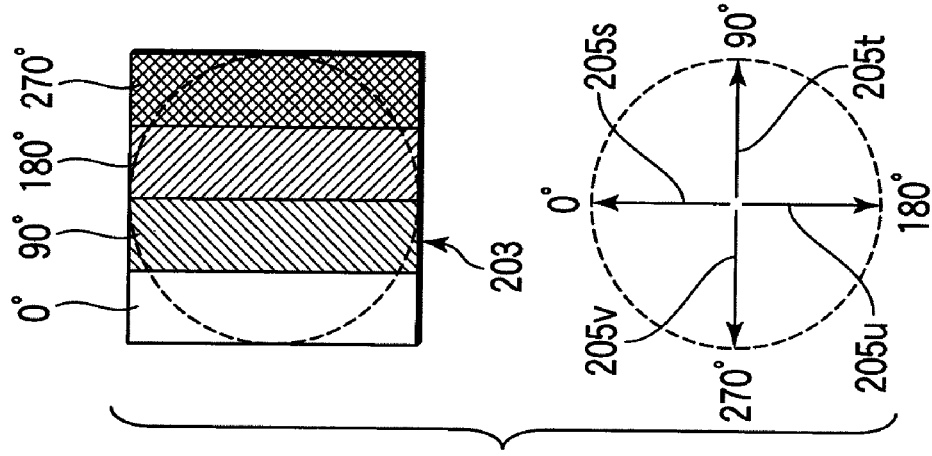
FIG. 14A to FIG. 14C are schematic views for explaining the relationship between the variation in phase and the light intensity within the point spread range, as described with reference to FIGS. 13A to 13D.
Figure 14B:
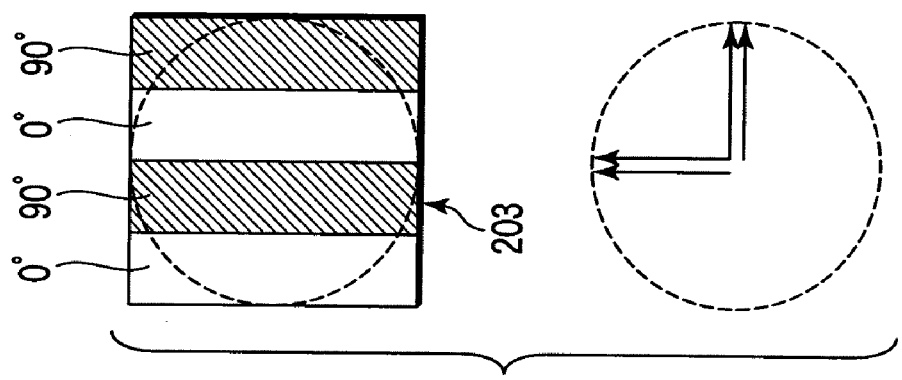
Figure 14A:
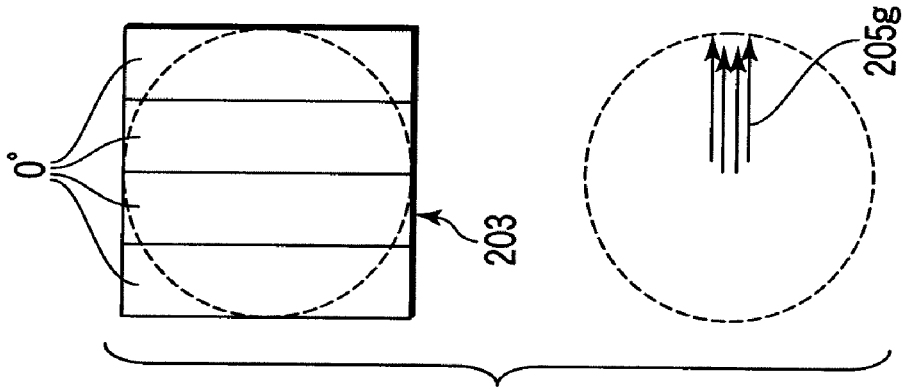

FIG. 14A to FIG. 14C are schematic views for explaining the relationship between the variation in phase and the light intensity within the point spread range R, as described with reference to FIGS. 13A to 13D.

FIG. 14A shows a case in which the phase values of four regions are all 0°. The sum of four phase vectors 205g each having an amplitude E in the 0° direction is an amplitude 204E, and the square thereof corresponds to a light intensity 16I. FIG. 14B shows a case in which the phase values of two regions are all 0°, and the phase values of the other two regions are 90°. The sum of the two phase vectors in the 0° direction and the two phase vectors in the 90° direction corresponds to $2\sqrt{2}E$, and the square thereof corresponds to a light intensity 8I.

FIG. 14C shows a case in which the phase value of 0°, the phase value of another region is 90°, the phase value of still another region is 180°, and the phase value of the other region is 270°. The sum of a phase vector 205s in the 0° direction, a phase vector 205t in the 90° direction, a phase vector 205u in the 180° direction and a phase vector 205v in the 270° direction is 0E, and the square thereof corresponds to 0I.

FIG. 15A and FIG. 15B are views for explaining the relationship between a pupil function and a point spread function of the image-focusing optical system 204. FIG. 15A shows the relationship between the pupil function and transmittance. FIG. 15B shows the relationship between the point spread function and pupil function. In general, the point spread function (FIG. 15B) is obtained by Fourier-transforming the pupil function (FIG. 15A). Specifically, in a case where the image-focusing optical system 204 has a uniform circular pupil and there is no aberration, the point spread function ASF (x, y) is expressed by the above-described formula (D).

In the case where the image-focusing optical system 204 has a uniform circular pupil and there is no aberration, it is known that a radius R/2 of a central region (i.e. Airy disc) prior to a point at which the point spread function first takes a value of 0 is expressed by equation (E), $$R/2=0.61\lambda/NA \quad (E)$$

In the present invention, as shown in FIG. 14B and FIG. 15B, the point spread range R refers to a circular central region prior to a point at which the point spread function F(x) first takes the value of 0. Now consider a case in which, as shown in FIG. 14A to FIG. 14C, a plurality (four in FIGS. 14A to 14C) of phase modulation units are included in a circle that optically corresponds to the point spread range R of the image-focusing optical system. In this case, it is possible to analytically control the light amplitude, i.e. the light intensity, by simple calculation on the basis of the sum of plural phase vectors 205g. Thereby, even a relatively complex light intensity distribution can be obtained relatively easily.

Thus, in the present invention, in order to freely control the light intensity, it is necessary that the phase modulation unit of the phase modulation element 203 be optically smaller than the radius, i.e. R/2, of the point spread range R (see FIG. 13B) of the image-focusing optical system 204. In other words, it is necessary that the magnitude of the phase distribution, which is based on the phase modulation unit of the phase modulation element 203 in terms of the image-focusing plane (predetermined plane) of the image-focusing optical system on the image side of the image-focusing optical system 204, be smaller than the radius R/2 of the point spread range R of the image-focusing optical system 204. A unit range C shown in FIG. 12A is substantially equal in magnitude to the point spread range R that has been described with reference to FIG. 13B.

Figure 16A:
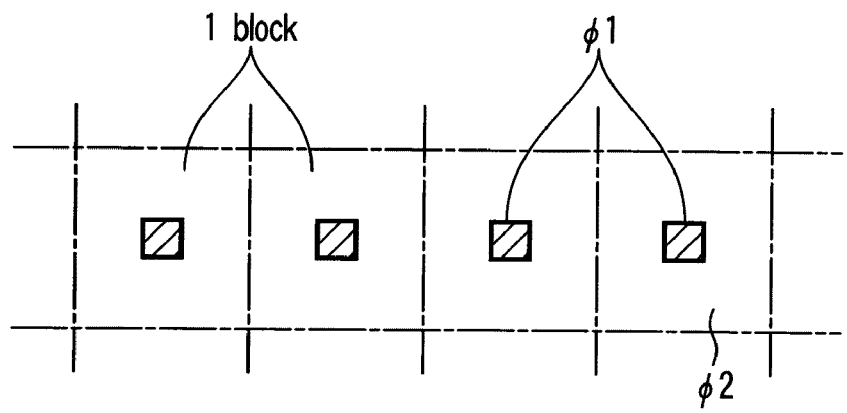
FIG. 16A to FIG. 16C are schematic views for describing the ratio (duty ratio) of a transmissive part in the mark pattern described with reference to FIG. 11, in a case where a part with a first phase value and a part with a second phase value are paired.
Figure 16B:
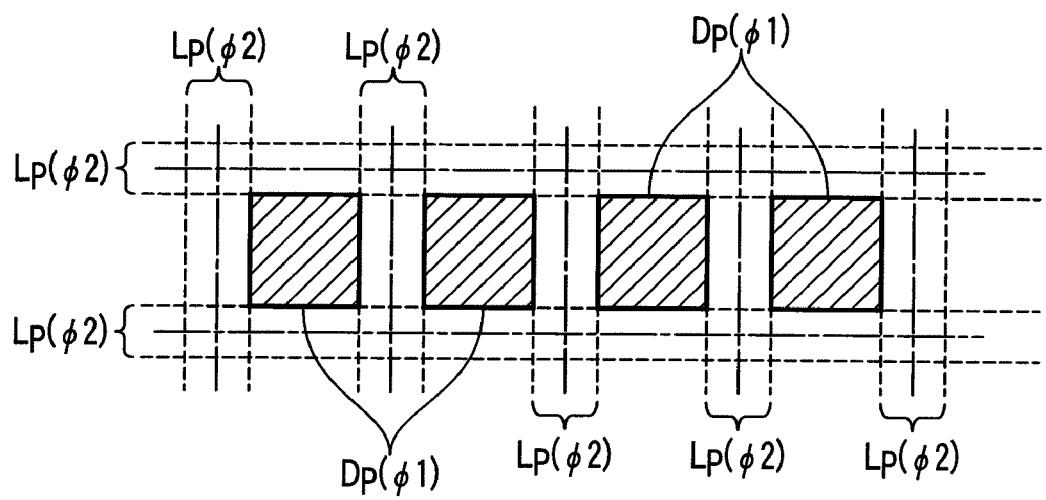
Figure 16C:
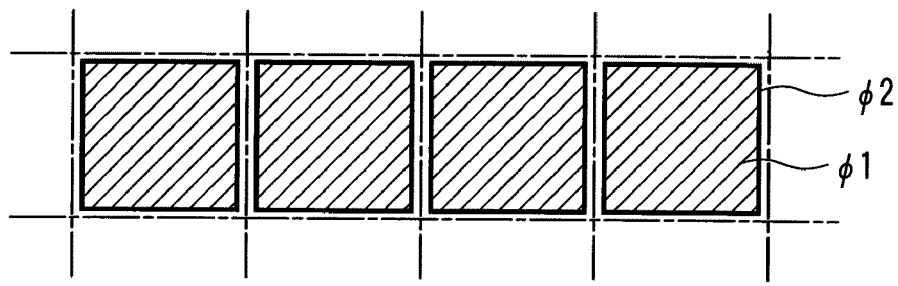

The mask pattern MK, which has been described with reference to FIG. 11, alters the area (duty ratio) D of the region for varying the phase value and the phase difference thereof in units of 1 block (1 unit), as shown in FIGS. 16A to 16C. Thus, as will be described later with reference to FIG. 17, the intensity of transmissive light can freely be set. If FIG. 16B is referred to by way of example, parts that do not vary the phase value or parts that provide a first phase value φ2 are formed by lines Lp that intersect at right angles. Thereby, the parts with a different phase value, i.e. parts with a second phase value φ1, are formed in dots Dp. Needless to say, the parts with first phase value φ2 and the parts with second phase value φ1 may be reversed. In addition, the area in which the phase value is varied per 1 block can freely be set. FIG. 16A shows an example in which the duty ratio D is about 5%, FIG. 16B shows an example in which the duty ratio D is about 50%, and FIG. 16C shows an example in which the duty ratio D is about 90%.

FIG. 17 shows a ratio of occupation area by the transmissive part (the abscissa in FIG. 17) per pitch (1 unit), which is a pair of the part with a first phase value and the part with a second phase value of the phase modulation element that has been described with reference to FIG. 11 and FIG. 12A. That is, FIG. 17 shows the relationship between the variation in area ratio of the regions with different phase values, as shown in FIGS. 16A to 16C, and the intensity (%) of light radiated on the substrate.

As is clear from FIG. 17, the intensity of light that passes through the phase modulation element 203 can freely be set by varying the ratio in area between the part with the first phase value and the part with the second phase value in 1 unit of the phase modulation regions of the phase modulation element 203. The magnitude of 1 unit of the phase modulation region is determined by the magnitude of the unit range C that has been described with reference to FIG. 11 and FIG. 12A.

As has been described previously, the magnitude of the unit range C is determined by the NA of the lens (illumination optical system 202) of the crystallizing apparatus and the wavelength λ of light emitted from the light source 201. In the case of forming the part with the first phase value and the part with the second phase value of 1 unit of the phase modulation region of the phase modulation element 203, the unit range C (see FIG. 11 and FIG. 12A) has to be set at λ/NA or less.

As is clear from FIG. 17, in the case where the phase difference θ is set at any one of θ=60° (or 300°) θ=90° (or 270°) θ=120° (or 240° and θ=180°, the light intensity takes a maximum value when the duty ratio D is 50%, as described with reference to FIG. 16A to FIG. 17C, and the light intensity gradually decreases in the range of duty ratio D between 0% and 50%. On the other hand, it is confirmed that the light intensity gradually increases in the range of duty ratio D between 50% and 100%.

This variation in light intensity can be explained by the following equation (F), $$I=(2-2\cos\theta)D^2-(2-2\cos\theta)D+1 \tag{F}$$

where I is the light intensity, θ is the phase difference and D is the duty ratio (the ratio in area between regions with different phase values).

Thus, when the alignment mark is formed on the semiconductor film on the substrate by using the phase-value modulation type mask pattern MK, the optimal light intensity of exposure light is arbitrarily set on the basis of the factors on the semiconductor film side, such as the composition, thickness, etc. of the semiconductor film on the substrate, and the phase difference imparted to the mask pattern MK and the duty ratio D thereof.

Third Embodiment

Next, a description is given of an embodiment of a transmission light amount modulation type, wherein a mark pattern MK, for instance, a metallic material capable of blocking light, is arranged on a glass substrate with a predetermined width (area) and interval (space).

FIG. 18 shows a case in which the mark pattern MK is applied to a method other than the above-described method of varying phase values. In this third embodiment, alignment marks are formed on a semiconductor film on the substrate, using a light-blocking type mask pattern MK. The technique to be described below is applicable to uses other than the formation of alignment marks.

In this case, metal thin films that block light are selectively provided. Thus, a shield part PS (or Pt) and a non-shield part (i.e. transmissive part) Ss (or St) having a predetermined area per 1 block (1 unit) are disposed. For example, as shown in FIGS. 19A to 19C, in each 1 block (1 unit), the area of the region that suppresses light transmission, that is, the ratio between the shield part Ps (or Pt) and the non-shield part Ss (or St), is varied. By this method, as will be described with reference to FIG. 20, the intensity of light passing through the mark pattern MK can freely be set. Needless to say, the non-shield part and the shield part can arbitrarily be fabricated in accordance with the method of selectively providing the metal thin film.

Referring to FIG. 19B by way of example, if non-shield parts are formed by spaces Ss that intersect at right angles, shield parts Ps are formed in dot shapes. If striped metal thin films St that extend in directions at right angles are provided, non-shield parts Pt are formed in dot shapes. Since the transmissive parts and shield parts have reverse patterns, the number of kinds of the mark pattern MK is two if only the ratio in area is considered.

To be more specific, as shown an FIGS. 19A to 19C, the area ratio, i.e. (area of shield part/area of 1 unit), is set as the duty ratio D per 1 unit (comprising about 4 to 9 blocks and corresponding to the unit range C, as previously described with reference to FIG. 11 and FIG. 12A). Thereby, as will be described with reference to FIG. 20, the intensity of light passing through the mark pattern MK of the phase modulation element can freely be set. FIG. 19A shows a case in which the duty ratio D is about 0% (total transmission or non-light-blocking), FIG. 19B shows a case in which the duty ratio D is about 50%, and FIG. 19C shows a case in which the duty ratio D is about 100% (total light blocking).

Figure 20:
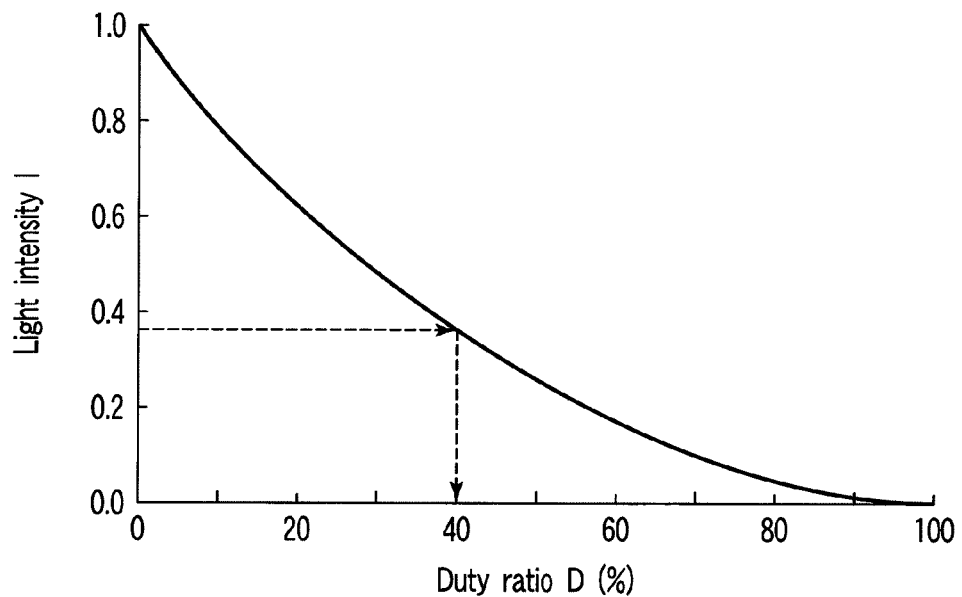
FIG. 20 is a graph for explaining the variation in intensity of transmissive light in the case where the ratio between the shield part and non-shield part is varied in units of 1 block (unit), as described with reference to FIGS. 19A to 19C.

FIG. 20 is a graph for explaining the variation in intensity of light passing through the phase modulation element 203 in the case where the light-blocking metal thin film, as described with reference to FIGS. 19A to 19C by way of example, are provided and the ratio between the shield part and non-shield part, i.e. the duty ratio D, is varied. The magnitude of 1 unit of the non-shield part is determined by the magnitude of the unit range C that has been described with reference to FIG. 11 and FIG. 12A. In addition, the magnitude of the unit range C is determined by the NA of the lens (illumination optical system 202) of the crystallizing apparatus and the wavelength λ of light emitted from the light source 201. This has already been described above.

As is clear from FIG. 20, in the case where the duty ratio D is set at any of D=0% (total transmission), D=50% and D=100% (total blocking of light), the light intensity takes a maximum value when the duty ratio D is 100%, and the light intensity gradually decreases from the duty ratio of 0% (total transmittance).

This variation in light intensity can be explained by the following equation (G), $$I=(1-D)^2=D^2-2D+1 \quad (F)$$

where I is the light intensity, and D is the duty ratio (shield area/transmissive (non-shied) area).

Thus, when the alignment mark is formed on the semiconductor film on the substrate by using the light blocking type mask pattern MK, the optimal light intensity of exposure light is arbitrarily set on the basis of the factors on the semiconductor film side, such as the composition, thickness, etc. of the semiconductor film on the substrate, and the ratio (duty ratio) D, i.e. (the shield area/transmissive area) of the mask pattern MK.

Figure 21B:
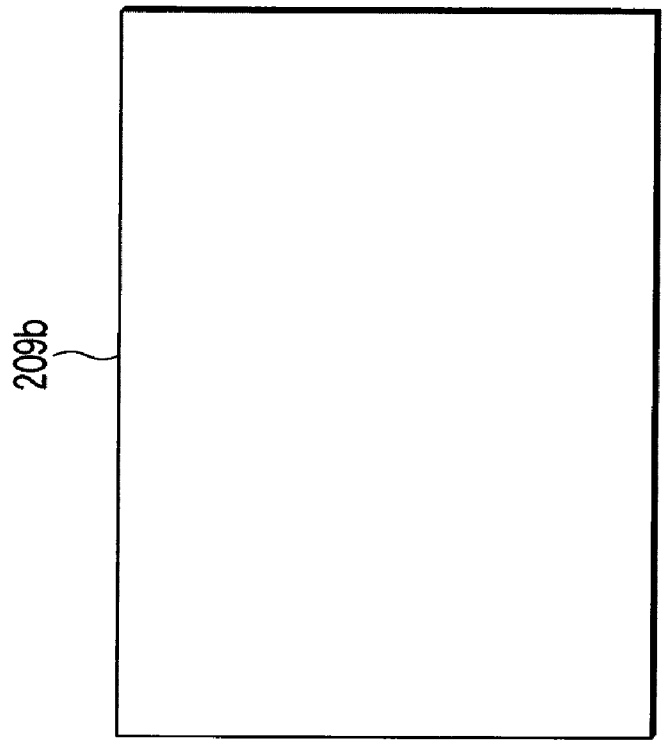
FIG. 21A and FIG. 21B are schematic views for describing an example of a light intensity varying pattern, which provides a light intensity that is applicable in order to form an alignment mark on a semiconductor film at the same time as light with a predetermined intensity is radiated on the semiconductor film for crystal growth.
Figure 21A:
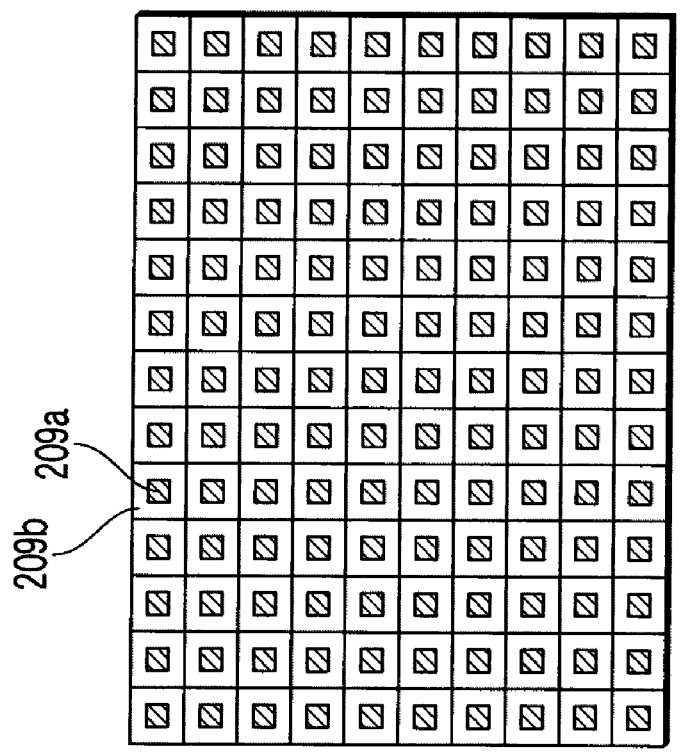

Referring now to FIG. 21A and FIG. 21B, a description is given of measured results of the variation in intensity of light, which was varied by using the transmission light amount modulation type pattern capable of providing a predetermined light intensity, as described with reference to FIG. 18 and FIGS. 19A to 19C.

For example, in order to grow a large-grain-sized single-crystal silicon grain, a fluence (irradiation light) of, e.g. about 1 J/cm² is necessary. However, when a pattern comprising no region for varying the phase value and comprising only a total-transmissive region 209b, as shown in FIG. 21B, the light with the fluence of 1 J/cm² is directly radiated on the semiconductor film, as indicated by a curve b in FIG. 22. Consequently, the above-mentioned ablation occurs, and it is difficult to form a pattern that is recognizable as an alignment mark.

By contrast, as shown in FIG. 21A, the transmission light amount, i.e. the light intensity, can arbitrarily be set by providing a region 209a, which can vary the light-blocking area at a predetermined ratio (area ratio), on the light transmissive region 209b. As regards the pattern shown in FIG. 21A, it was confirmed by simulation that when the duty ratio (non-shield part area/total area) is set at, e.g. 40% and the light transmission amount of fluence of 1 J/cm² is normalized as "1", the light intensity becomes about 60%, as indicated by a curve a in FIG. 22.

Figure 22:
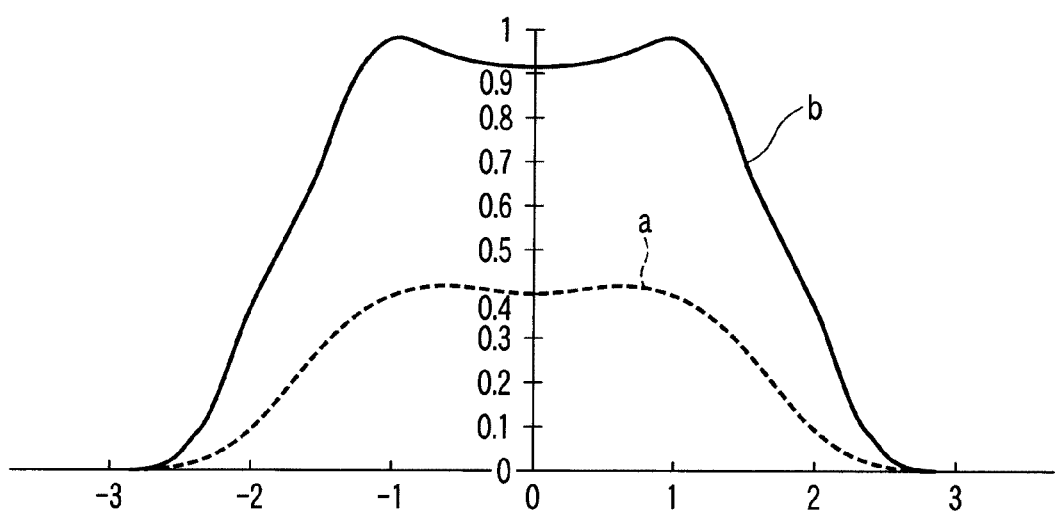
FIG. 22 is a graph for explaining an example of a light intensity distribution that is obtained by applying light with a predetermined intensity to a semiconductor film on the insulating substrate with use of the pattern shown in FIGS. 21A and 21B.

FIG. 23A and FIG. 23B are enlarged photographs showing examples of results, which are obtained when light with a fluence of 1 J/cm² was radiated on semiconductor films on the same substrate in the same fabrication step, on the basis of the principle that is explained with reference to FIGS. 21A and 21B and FIG. 22.

FIG. 23A shows a case in which light with a predetermined intensity was radiated using a pattern that has a region with a predetermined phase value functioning as a phase modulation element and that can limit the fluence of radiation light to a predetermined intensity. In this case, it is recognized that there is a difference in contrast, which corresponds to the original pattern, on the substrate (test sample).

On the other hand, FIG. 23B shows a case in which light with a predetermined intensity was radiated on the same substrate (test sample) in the same fabrication step using a non-intensity-restricting pattern, that is, a pattern that does not function as a phase modulation element. As shown in FIG. 23B, the semiconductor film on the substrate looks black and the original pattern is not recognizable. It is reasonable to consider that ablation (film destruction) occurred in the semiconductor film on the substrate.

FIG. 24 is an enlarged view of a region A in FIG. 23A. In FIG. 24, a central part where the density of color on the background varies corresponds to a boundary part in FIG. 23A where the density of color on the background varies. In addition, as is clear from FIG. 24, patterns formed on the semiconductor film on the substrate have a pitch of 3 μm, and even the patterns that are usable as alignment marks have a sufficient resolution.

FIG. 25 shows a detection result that was obtained when a mark, which was formed on the semiconductor film on the substrate using the pattern shown in FIG. 23A, was detected by a well-known photolithography apparatus. It is understood from FIG. 25 that signal detection, which is similar to the case of alignment detection in an ordinary step of a photolithography apparatus, is possible.

In short, by applying the above-described principle of the present invention (i.e. by using the pattern capable of arbitrarily setting the intensity or phase value of transmissive irradiation light on the basis of, e.g. the variation in ratio in area), it becomes possible to grow a large-grain-sized single-crystal silicon grain and to form the alignment mark on the semiconductor film on the substrate without causing ablation.

As has been described above, with use of the light modulation elements according to the second and third embodiments, when light with a predetermined intensity distribution (predetermined fluence) is radiated on the semiconductor film on the substrate and a semiconductor crystal of the semiconductor film is grown, the alignment mark that is usable in a subsequent step can be formed in the same step as the crystallization process in which large particles are fabricated.

This facilitates alignment, for example, at a time of forming a semiconductor active device, etc. on the associated grown crystal region of the semiconductor film. The alignment mark can be formed at a desired position on the semiconductor film in which crystals are to be grown, by shifting the position of the mark pattern that is incorporated in the phase modulation element. In the present invention, even if the alignment mark is provided at a desired position on the semiconductor film on the substrate, no adverse effect is caused on the characteristics of the semiconductor active device, etc., which are to be formed in a subsequent fabrication step.

The light modulation element shown in each of the second and third embodiments includes two or more kinds of light intensity modulation regions that modulate light and provide a predetermined light intensity distribution. At least one kind of light intensity modulation region is composed of two kinds of basic patterns. The first basic pattern is characterized by comprising a set of a light-blocking region and a light-transmissive region. The second basic pattern is characterized by comprising only a light-blocking region, or a set of a light-blocking region, which has a greater ratio in area of the light-blocking region than that of the first basic pattern, and a light-transmissive region.

This structure may be described as the shield part Ps (Pt) and non-shield part or transmissive region Ss (St) of each block of the mark pattern MK(3) shown in FIGS. 18 and 19A-19C, and the light modulation element 203 in which the mark pattern MK is integrally formed.

In addition, the light modulation element according to the second and third embodiments is characterized by comprising two or more kinds of light intensity modulation regions, wherein at least one kind of light intensity modulation region includes a first basic pattern, which comprises a set of two or more kinds of phase modulation regions having different phase modulation values, and a second basic pattern, which comprises only a region with a single phase value or a set of two or more kinds of phase modulation regions having an area ratio different from an area ratio of the first basic pattern.

This structure may be described as the first phase value φ1 (or Dp) and second phase value φ2 (or Lp) of each block of the mark pattern MK(3) shown in FIG. 11 and FIGS. 16A to 16C, and the light modulation element 203 in which the mark pattern MK is integrally formed.

The method according the second and third embodiments is a crystallizing method for radiating light with two or more kinds of light intensity distributions to a non-single-crystal semiconductor film and crystallizing the non-single-crystal semiconductor film, wherein of first and second light intensity distribution regions for providing the two or more kinds of light intensity distributions, the second light intensity distribution region is composed of two kinds of regions with different light intensities, and a relationship, $$I_1 > I_2 > I_3$$

is established, where $I_1$ is a maximum value of light intensity of the first light intensity distribution region, and $I_2$ and $I_3$ are a high value and a low value, respectively, of the light intensity of the second light intensity distribution region.

When a minimum light intensity, at which ablation occurs in the non-single-crystal semiconductor film due to radiation of light with a uniform light intensity distribution, is $I_a$, a relationship, $$I_a > I_2 > I_3$$

is established.

On the other hand, when a minimum light intensity, at which the non-single-crystal semiconductor film is melted by radiation of light with a uniform light intensity distribution, is $I_c$, a relationship, $$I_2 > I_c > I_3$$

is established.

Fourth Embodiment

FIGS. 27A to 27F are cross-sectional views illustrating steps of forming an electronic device, such as a semiconductor active device, in a region that is crystallized using the crystallizing apparatus capable of forming alignment marks, as described in the second and third embodiments.

Figure 27A:
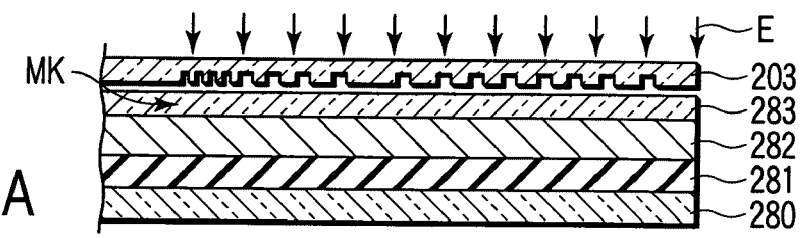
FIG. 27A to FIG. 27F are schematic views that illustrate examples of fabrication steps for forming an electronic device (semiconductor active device) on a to-be-processed surface of an insulating substrate using the phase modulation element shown in FIG. 11.

As shown in FIG. 27A, an insulating substrate 280 of, e.g. alkali glass, quartz glass, plastic or polyimide, is prepared. On the insulating substrate 280, an undercoat film 281, an amorphous semiconductor film 282 and a cap film 283 are formed by CVD or sputtering. The undercoat film 281 is formed of, e.g. a stacked layer of SiN with a thickness of 50 nm or $SiO_2$ with a thickness of 100 nm. The amorphous semiconductor film 282 is formed of, e.g. Si, Ge or SiGe with a thickness of, e.g. about 50 nm to 200 nm. The cap film 283 is formed of, e.g. $SiO_2$, SION, $SiO_x$ or SiN.

Then, a laser beam E, such as a KrF excimer laser beam or an XeCl excimer laser beam, is radiated on a part or the entirety of the surface, for example, a predetermined region, of the amorphous semiconductor film 282 and cap film 283 via the phase modulation element 203 on which the mark pattern MK, as described with reference to FIG. 12A by way of example, is integrally formed.

As shown in FIG. 26, for example, the phase modulation device 203 is provided with a mark pattern MK for alignment, as well as a phase shift pattern SP for causing crystal growth in the substrate 206 that is the object of processing.

As previously described referring to FIG. 12A, the phase modulation element 203 includes a line & space pattern 230 comprising line parts 231 and space parts 232, which are optically smaller in width than the diameter of the above-described point spread range (indicated by a circle C in FIG. 12A) of the image-focusing optical system 204. In general, when the term "line & space pattern" is simply used, it refers to a pair of a transmissive region and a non-transmissive region. In this specification, a repetition of two different phases is referred to as "line & space pattern".

In FIG. 12A, each line part 231 (indicated by hatching) has a first phase value φ1 (e.g. 0°). Each space part 232, which is depicted as a blank without hatching, has a second phase value φ2 (e.g. 180°). The ratio in width between the neighboring line part 231 and space part 232 varies in the direction of arrow x. That is, when the part with the first phase value φ1 and the part with the second phase value φ2 are paired and the pitch is indicated, the ratio of occupation area of the part with the first phase value φ1 varies in the direction of arrow x.

The phase modulation element 203 shown in FIG. 12A has such a phase distribution that the ratio in occupied area between the line part 231, which is a first region with the phase value φ1, and the space part 232, which is a second region with the phase value φ2, varies from position to position.

As has been described above, the light intensity distribution on the substrate 206 can be controlled to have a predetermined value by properly varying the ratio in occupied area between the line part 231 and the space part 232, which are included in the unit range C that optically corresponds to the point spread range of the image-focusing optical system 204.

Specifically, as shown in FIG. 12A, the line & space pattern 230 is formed such that the central region in the longitudinal direction (arrow x) is substantially set at the first phase value φ1 (0° and the ratio of the area with the second phase value φ2 (180°) gradually increases toward both end portions in the direction of arrow x.

Incident light that travels through the phase modulation element 203 in the direction of arrow z (i.e. the direction from the front side to the back side of the sheet of FIG. 12B) has a maximum light intensity when it passes through the central position 230A of the line & space pattern 230, as shown in FIG. 12B. On the other hand, incident light that passes through both-side positions 230B of the phase modulation element 203 has a minimum light intensity.

With use of the phase modulation element 203 having the shift pattern shown in FIG. 12A, it becomes possible to obtain such a zigzag-pattern light intensity distribution that V-shaped components and inverted-V-shaped components are alternately arranged in the longitudinal direction (arrow x). In this case, the peak of light intensity is provided by the light that passes through the nearly central position 230A in the direction of arrow x on the phase modulation element 203.

As has been described above, using the phase modulation element 203 shown in FIG. 12A, it is possible to obtain such an intensity distribution pattern that a bottom value of the light intensity distribution is set at a predetermined position and the intensity gradually increases from the bottom value toward the peripheral parts, as shown in FIG. 12B. Using the light with this intensity distribution pattern, a large-grain-sized crystal can be grown (lateral growth) from a crystal seed along the planar direction (x direction) of the substrate 206. Thereby, a large-grain-sized crystallized semiconductor film can be formed.

In particular, of concave-curve type distribution patterns, a V-pattern light intensity distribution, in which the light intensity linearly increases toward the peripheral parts, provides a linear temperature gradient toward the peripheral parts. Thus, without interruption of crystal growth, a crystallized semiconductor film with a still greater grain size can be produced. As shown in FIG. 12B, a light intensity distribution with unnecessary irregularities does not occur. Thus, by using the light intensity distribution with the above-described pattern, crystal grains can be produced in an array with a high filling ratio.

Setting the length between the center and the end of the phase modulation element at 5 µm is advantageous in arranging electronic devices (semiconductor active devices), such as TFTs (thin-film transistors), at a pitch of 10 µm, which are to be fabricated in subsequent steps.

On the other hand, the intensity of light that passes through the phase modulation element 203 including the region of the mark pattern MK is set at a predetermined value at the position corresponding to the mark pattern MK, as shown in FIG. 12C, and thus the mark is formed on the substrate that is to be processed. At this time, if the mark pattern MK is of the phase modulation type, the intensity of light, which is to be passed through the mark pattern MK, is set at the level that has been described with reference to FIG. 16A to FIG. 16C, FIG. 17 and the formula (F). In addition, if the mark pattern MK is of the light intensity modulation type, i.e. of the light-blocking type, the intensity of light, which is to be passed through the mark pattern MK, is set at the level that has been described with reference to FIG. 19A to FIG. 19C, FIG. 20 and the formula (G).

The mark pattern MK should desirably be formed at such a given position as to cause no adverse effect on the characteristics of the semiconductor active device, etc., which are to be formed in a subsequent fabrication step. It is thus desirable that the mark pattern MK, which is provided on the phase modulation element 203 shown in FIG. 26, be formed at a position other than the position where a crystal seed for crystal growth is to be produced on the to-be-processed glass substrate 206, or at a position other than the range that extends from the crystal seed as the center and corresponds to the region where the active device, such as a TFT (thin-film transistor), is to be formed. In this case, in the region where the phase shift pattern SP or mark pattern MK is not present, the intensity of irradiation light is not modulated and the light is processed with its intensity being maintained. If necessary, the light may be blocked by a shield film or the like.

Figure 27B:
Figure 28:
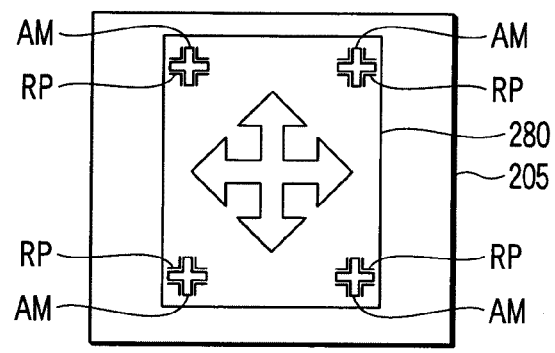
FIG. 28 is a schematic view for describing an example in which the substrate is moved along the plane of the substrate with reference to alignment marks AM in the steps of forming the electronic device illustrated in FIGS. 27A to 27F.

By the irradiation of the laser beam E on the substrate 280, the semiconductor film 282 on the substrate 280 is once melted, as shown in FIG. 27B. When the semiconductor film 282 is crystallized, a polycrystalline semiconductor film or single-crystal semiconductor film 284, which includes a large-grain-sized crystal, is produced. At the same time, an alignment mark 284A is formed at a predetermined position of the polycrystalline semiconductor film or single-crystal semiconductor film 284, which corresponds to the mark pattern MK that is formed integral with the phase modulation element 203. The position of the substrate 280 is determined with reference to the alignment mark 284A that is read by a scanning detection device (not shown) of the photolithography apparatus. Subsequently, the substrate 280 that is held by the stage 205 is moved in two axial directions along the plane of the substrate 280, as will be described later with reference to FIG. 28.

Figure 27C:
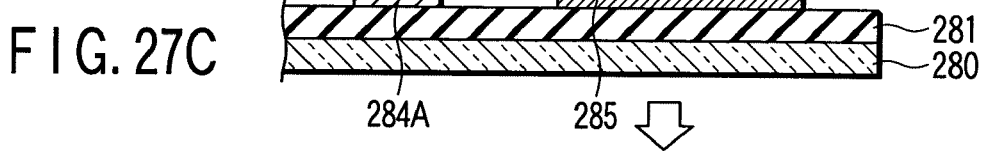

As shown in FIG. 27C, using photolithography technology, the polycrystalline semiconductor film or single-crystal semiconductor film 284 is patterned in a predetermined shape so as to form a semiconductor film 285, which is to be used, for example, as a channel region, a source region, a drain region, etc. of a thin-film transistor, and an alignment mark 284A that is to be left on the substrate 280.

Figure 27D:
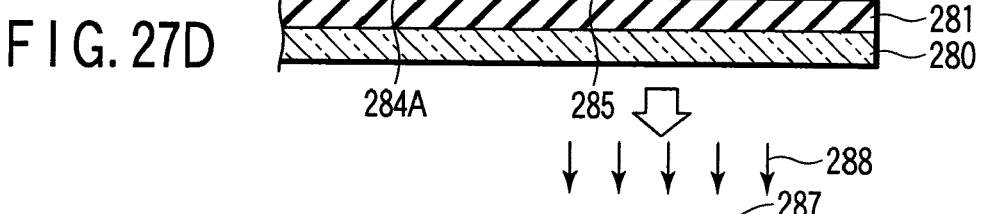

Next, as shown in FIG. 27D, an SiO$_2$ film with a thickness of 20 nm to 100 nm, which is to be used, for example, as a gate insulation film 286, is formed on the surfaces of the semiconductor film 285 and alignment mark 284A by CVD, sputtering, etc.

Figure 27E:
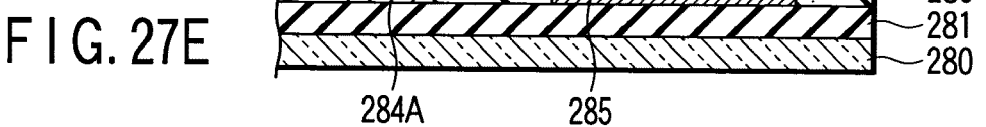

As shown in FIG. 27E, on the gate insulation film 286, a metal thin film with a predetermined thickness, which is to be used as a gate electrode 287, is formed of a silicide, MoW, etc. Through a series of steps such as masking and etching, the metal thin film is patterned in a predetermined shape. Using the gate electrode 287 as a mask, impurity ions 288, such as phosphorus in the case of an N-channel transistor or boron (B) in the case of a P-channel transistor, are implanted. Although not shown, the resultant structure is annealed in a nitrogen atmosphere (e.g. for 1 hour at 450° C.), and the impurities are activated. Thus, a source region 291 and a drain region 292 are formed in the insular semiconductor film 285. Needless to say, the region, where no impurity ions 288 are implanted since the gate electrode 287 is used as the mask, becomes a channel 290.

Figure 27F:
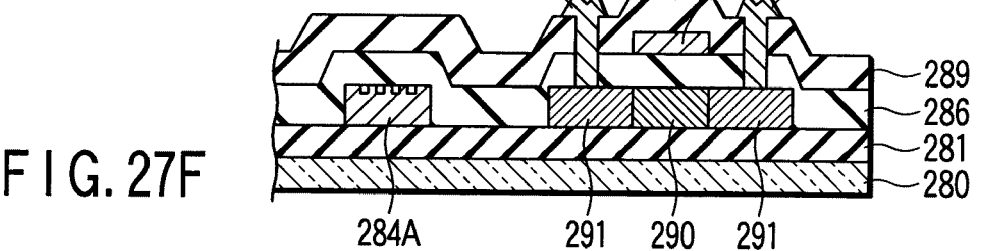

In a subsequent step of FIG. 27F, an interlayer insulation film 289 with a predetermined thickness is formed, and contact holes are made at predetermined positions by a step (not shown). A source electrode 293 and a drain electrode 294 are connected via the contact holes to the source region 291 and drain region 292 that are connected via the channel 290.

Through the above steps, the thin-film transistor (TFT) can be formed in the polycrystalline or single-crystal semiconductor.

The polycrystalline transistor or single-crystal transistor, which is fabricated by the above-described steps, is applicable to a driving circuit of a liquid crystal display, an EL (electroluminescence) display, etc., or to an integrated circuit such as a memory (SRAM, DRAM) or a CPU.

The alignment mark 284A can be formed at a desired position on the semiconductor film in which crystals are to be grown, by varying the position of the mark pattern MK that is incorporated in the phase modulation element. According to the present invention, even if the alignment mark is provided at a desired position on the semiconductor film on the substrate, no adverse effect is caused on the characteristics of the semiconductor active device, etc., which are to be formed in subsequent fabrication steps.

Next, a description is given of an embodiment in which a base material including a region that is crystallized by the crystallizing apparatus according to the second and third embodiment is applied to a display similar to the display shown in FIG. 8, for example, a liquid crystal display.

Figure 29:
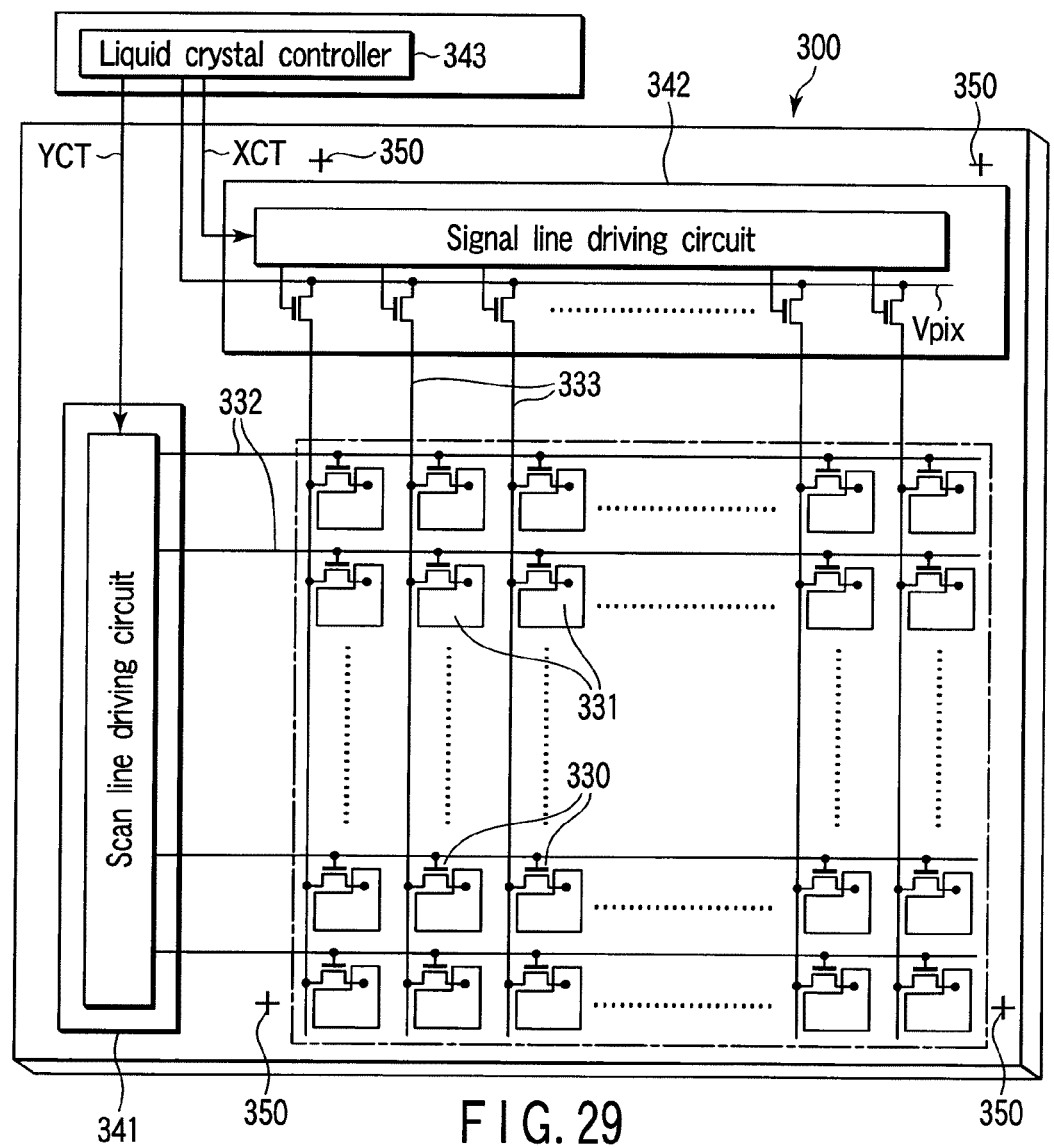
FIG. 29 schematically shows an example of a display that is manufactured using a transparent insulating substrate that supports the semiconductor film according to the present invention, alignment marks being pre-formed on predetermined regions of the surface of an amorphous semiconductor film using the phase modulation element described with reference to FIG. 12A.

FIG. 29 shows the case in which the second and third embodiments, wherein a large-grain-sized single-crystal silicon grain is grown at the same time as formation of an alignment mark 350, are applied. In the present embodiment, a display is fabricated using a transparent insulating substrate that supports a semiconductor film on which alignment marks 350 are formed in advance at predetermined regions on the surface of an amorphous semiconductor film. A given number of alignment marks 350 may be formed at predetermined intervals on the basis of a substrate process unit, for example, in units of a pixel as mentioned below, or in units of a group of pixels.

An active matrix liquid crystal display 300, for instance, is described. The liquid crystal display 300 includes a pair of transparent substrates that are opposed with a predetermined distance (not shown; see 91 and 92 in FIG. 8B), a liquid crystal layer (not shown; see 93 in FIG. 8B), pixel electrodes 331, scan lines 332, signal lines 333, a counter-electrode (not shown; see 97 in FIG. 8B), and TFTs 330.

The paired transparent substrates may be formed of, e.g. glass substrates. The transparent substrates are bonded to each other via a seal material (not shown) so as to keep the inside airtight. At least one of the substrates includes a semiconductor film on which alignment marks 350 are formed in advance at predetermined regions on the surface of an amorphous semiconductor film by means of the phase modulation element described with reference to FIG. 12A, for example. Using the alignment marks, a predetermined pattern or electrode structure is formed.

The liquid crystal layer is sealed in the region that is surrounded by the seal material between the paired transparent substrates. On the inner surface of one of the paired transparent substrates, there are provided a plurality of pixel electrodes 331 arranged in a matrix in row and column directions at right angles, a plurality of TFTs 330 electrically connected to the associated pixel electrodes 331, and scan lines 332 and signal lines 333 that are electrically connected to the TFTs 330.

The scan lines 332 extend in parallel in the row direction of the pixel electrodes 331. The scan lines 332 are connected at one end to a plurality of scan line terminals (not shown) that are provided at predetermined positions on the transparent substrate. The scan line terminals are connected to a scan line driving circuit 341.

The signal lines 333 extend in parallel in the column direction of the pixel electrodes 331. The signal lines 333 are connected at one end to a plurality of signal line terminals (not shown) that are provided at predetermined positions on the transparent substrate. The signal line terminals are connected to a signal line driving circuit 342.

The scan line driving circuit 341 and signal line driving circuit 342 are connected to a liquid crystal controller 343. The liquid crystal controller 343 receives image signals and sync signals that are supplied, for example, from outside, and generates a pixel video signal Vpix, a vertical scan control signal YCT and a horizontal scan control signal XCT.

The inner surface of the other transparent substrate is provided with a film-like transparent counter-electrode that is opposed to the pixel electrodes 331. In addition, the inner surface of the transparent substrate may be provided with color filters in association with pixel sections where the pixel electrodes 331 and the counter-electrode are opposed, and may also provided with light-blocking films in association with regions between the pixel sections.

Polarizer plates (not shown) are provided on the outer sides of the paired transparent substrates. In the case of a transmissive liquid crystal display, a surface-emission light source (not shown) is provided on the back surface of the transparent substrate. Needless to say, the liquid crystal display may be of a reflective type or a trans-reflective type.

As has been described above, according to the optical elements of the second and third embodiments, when light with a predetermined light intensity distribution is radiated on a to-be-processed object, light with intensity of a specific pattern can be radiated on a desired position at the same time.

With use of the phase modulation elements of the second and third embodiments, a crystal seed can be formed at an arbitrary position on a semiconductor film deposited with a predetermined thickness on the insulating substrate. A crystal can be grown from the crystal seed and an alignment mark can be formed at an arbitrary position on the semiconductor film in the same fabrication step.

Furthermore, a large-grain-sized crystallized semiconductor film is obtained by laterally growing a crystal from a crystal seed that is obtained by a crystallizing apparatus and a crystallizing method using the phase modulation element (optical element) according to the second and third embodiments. Using this large-grain-sized crystallized semiconductor film, a semiconductor active device, a liquid crystal display, etc., which are capable of high-speed operations and have good semiconductor characteristics, can be obtained.

The present invention is not limited to the above-described embodiments. Various modifications and changes can be made in practice without departing from the spirit of the invention. The embodiments can be properly combined as much as possible, and advantages based on the combinations can be obtained in such cases.

What is claimed is:

1. A method of forming an alignment mark on a semiconductor film, comprising:
    forming an amorphous or polycrystalline semiconductor film on a support substrate;
    forming a protective film having a heat accumulation effect on the semiconductor film; and
    irradiating an alignment mark forming element having an alignment mark profile corresponding to an alignment mark to be formed on the semiconductor film with laser light so that
    (i) a laser light beam having a phase-modulated light intensity distribution is emitted from the alignment mark forming element;
    (ii) an image is formed at a predetermined region on the semiconductor film by the laser light beam; and thus
    (iii) the region of the semiconductor film is heated and molten to form the alignment mark crystallized by the heat accumulation effect of the protective film.

2. The method of claim 1, wherein the shape of the image formed on the semiconductor film with the phase-modulated light substantially corresponds to the shape of the intensity distribution of the phase-modulated laser light.

3. The method of claim 1, wherein the alignment mark crystallized on the semiconductor film forms a thermal-metamorphic region having optical characteristics different from the semiconductor film such that the alignment mark is optically discriminable from the semiconductor film.

4. The method according to claim 1, further comprising:
    attaching the support substrate to another support substrate via a seal member, using the alignment mask on the semiconductor film to assemble a liquid crystal display.

5. The method according to claim 1, further comprising:
    dicing the semiconductor substrate into a plurality of smallest substrates, using the alignment mask on the semiconductor film.

6. The method according to claim 1, wherein the laser light is a homogenized beam with a two-dimensional uniform light intensity.

7. The method according to claim 1, wherein the alignment mark forming element includes a plate and an opening formed in the plate to pass the laser light, the opening defining the alignment mark profile.

8. The method according to claim 7, wherein the opening has a cross shape.

9. The method according to claim 1, wherein the alignment mark forming element includes a phase shifter for locally modulating an intensity of the laser light.

10. The method according to claim 1, wherein the alignment mark has optical characteristics that are different from those of a non-heated region of the semiconductor film.

11. The method according to claim 1, wherein the laser light beam is emitted from a laser source which emits a second laser light for crystallizing a portion or portions of the semiconductor film other than the region by which the alignment mark has been formed, using the alignment mark.

* * * * *